US012660268B2

(12) United States Patent
Konishi et al.

(10) Patent No.: US 12,660,268 B2
(45) Date of Patent: Jun. 16, 2026

(54) SILICON CARBIDE SUBSTRATE INCLUDING MULTIPLE SEMICONDUCTOR LAYERS HAVING A HIGH BREAK DOWN VOLTAGE

(71) Applicant: Proterial, Ltd., Tokyo (JP)

(72) Inventors: Kumiko Konishi, Tokyo (JP); Hiroyuki Okino, Tokyo (JP); Taisuke Hirooka, Tokyo (JP)

(73) Assignee: PROTERIAL, LTD., Tokyo (JP)

( * ) Notice: Subject to any disclaimer, the term of this patent is extended or adjusted under 35 U.S.C. 154(b) by 552 days.

(21) Appl. No.: 17/942,308

(22) Filed: Sep. 12, 2022

(65) Prior Publication Data

US 2023/0084128 A1 Mar. 16, 2023

(30) Foreign Application Priority Data

Sep. 16, 2021 (JP) ................................. 2021-151288
Nov. 25, 2021 (JP) ................................. 2021-190733
Jul. 13, 2022 (JP) ................................. 2022-112602

(51) Int. Cl.
H10D 62/17 (2025.01)
H10D 12/01 (2025.01)
(Continued)

(52) U.S. Cl.
CPC ......... H10D 62/393 (2025.01); H10D 12/031 (2025.01); H10D 30/66 (2025.01);
(Continued)

(58) Field of Classification Search
CPC .. H10D 62/393; H10D 30/66; H10D 62/8325; H10D 12/031; H01L 21/02529; H01L 21/02573
(Continued)

(56) References Cited

U.S. PATENT DOCUMENTS

2016/0336392 A1 11/2016 Tominaga et al.
2018/0082841 A1* 3/2018 Tawara ................... C30B 29/36
(Continued)

FOREIGN PATENT DOCUMENTS

JP 2017-019679 A 1/2017
JP 2020096004 A 6/2020
(Continued)

OTHER PUBLICATIONS

Extended European Search Report for European Patent Application No. 22195045.4, dated Feb. 9, 2023.
(Continued)

*Primary Examiner* — Norman D Richards
*Assistant Examiner* — Colin Russell McCutcheon
(74) *Attorney, Agent, or Firm* — McCormick, Paulding & Huber PLLC

(57) ABSTRACT

In a silicon carbide substrate including: a SiC substrate; and a first semiconductor layer, a second semiconductor layer and a drift layer that are epitaxial layers sequentially formed on the SiC substrate, an impurity concentration of the first semiconductor layer is lower than impurity concentrations of the SiC substrate and the second semiconductor layer, and the second semiconductor layer is formed to have a high impurity concentration or a large thickness.

6 Claims, 13 Drawing Sheets

(51) Int. Cl.
  H10D 30/66 (2025.01)
  H10D 62/832 (2025.01)
  H10P 14/20 (2026.01)

(52) U.S. Cl.
  CPC ..... H10D 62/8325 (2025.01); H10P 14/3408
  (2026.01); H10P 14/3441 (2026.01)

(58) Field of Classification Search
  USPC .......................................................... 257/77
  See application file for complete search history.

(56) References Cited

U.S. PATENT DOCUMENTS

2019/0040545 A1 * 2/2019 Nakamura ........ H01L 21/02579

2020/0006066 A1    1/2020 Konishi et al.
2020/0365721 A1 * 11/2020 Lichtenwalner ....... H10D 62/60
2022/0059658 A1    2/2022 Hori et al.

FOREIGN PATENT DOCUMENTS

WO        2015115202 A1    8/2015
WO        2016/092887 A1    6/2016
WO   WO-2018150861 A1 *    8/2018   ............. C30B 29/36
WO        2020115951 A1    6/2020

OTHER PUBLICATIONS

Japanese Office Action in connection with Japanese Patent Application No. 2022-112602, dispatched Mar. 3, 2026, 6 pages, and its English Translation, 5 pages, 11 pages total.

* cited by examiner

SILICON CARBIDE SUBSTRATE INCLUDING MULTIPLE SEMICONDUCTOR LAYERS HAVING A HIGH BREAK DOWN VOLTAGE

CROSS-REFERENCE TO RELATED APPLICATION

This application claims foreign priority benefits under U.S.C. § 119 from Japanese Patent Applications No. 2021-151288 filed on Sep. 16, 2021, No. 2021-190733 filed on Nov. 25, 2021, and No. 2022-112602 filed on Jul. 13, 2022, the contents of each of which are hereby incorporated by reference in its entirety.

TECHNICAL FIELD

The present invention relates to a silicon carbide substrate and a method of manufacturing the same.

BACKGROUND

Not only a high breakdown voltage but also a low ON resistance and a low switching loss are required for each of semiconductor power elements. However, silicon (Si) power elements that are current trends nearly reach logical performance limits. Silicon carbide (SiC) has a dielectric-breakdown field that is one digit larger than that of Si, and therefore, its element resistance can be logically reduced by three digits or more when a thickness of a drift layer for holding the breakdown voltage decreases to about $\frac{1}{10}$ times while an impurity concentration increases to about 100 times. And, since its band gap is about three times larger than that of Si, its high-temperature operation is possible, and therefore, the SiC semiconductor element has been expected to have a performance exceeding that of the Si semiconductor element.

It is known that crystal rearrangement is relatively easily caused in the SiC because the SiC has some stable crystal structures, energy levels of which are close to one another, which results in expansion of a BPD (Basal Plane Dislocation) existing in the crystal and becoming stacking fault when receiving a recombination energy between injected hole and electron. The stacking fault decreases minority carrier lifetime or becomes majority carrier trap, and therefore, its large expansion increases a resistance, and degrades element characteristics. Such phenomena reduce the element reliability, and therefore, countermeasures for reducing the BPD have been developed.

A Patent Document 1 (International Patent Publication No. WO/2018/150861) describes that the BPD is converted to TED (Threading Edge Dislocation) by formation of a first semiconductor layer (first epitaxial layer) having an impurity concentration of $1 \times 10^{17}$ cm$^{-3}$ or lower that is lower than an impurity concentration of a SiC substrate but higher than an impurity concentration of a drift layer, on a SiC substrate. Further, on the first semiconductor layer, a second semiconductor layer (second epitaxial layer) having an impurity concentration higher than that of the first semiconductor layer is formed to suppress expansion of a depletion layer.

A Patent Document 2 (International Patent Publication No. WO/2016/092887) describes a structure of also suppressing increase of the ON resistance without decrease of the breakdown voltage by making the concentration of the second epitaxial layer equal to or higher than $1 \times 10^{17}$ cm$^{-3}$ while thinning its thickness when the expansion of the stacking fault is controlled by sequential formation of the first epitaxial layer, the second epitaxial layer and a third epitaxial layer on the SiC substrate.

Patent Document 1: International Patent Publication No. WO/2018/150861

Patent Document 2: International Patent Publication No. WO/2016/092887

SUMMARY

A lot of BPDs exist in the SiC substrate. Even if the BPD is converted to the TED by the epitaxial film formed on the substrate, the hole and the electron are recombined in the substrate by the injection of the hole into the substrate during the element operation, and, as a result, the stacking fault is grown from the BPD of the substrate. The stacking fault expands into the epitaxial layer, and therefore, a problem of the increase of the element resistance value arises.

It is also possible to set an operation condition preventing the hole from excessively flowing to the substrate of the element. However, the hole may be excessively injected more than expected, due to a surge current, unbalancing among parallel elements or others. And, an amount of the hole injected into the substrate during the element operation varies depending on a rated voltage of the element or the maximum current density of the element.

A method of increasing an efficiency of the conversion of the BPD existing in the substrate to the TED by the epitaxial film formed on the substrate and preventing the hole from being injected into the substrate during the element operation as described above is not disclosed in the Patent Documents 1 and 2.

Other objects and novel characteristics will be apparent from the description of the present specification and the accompanying drawings.

The outline of the typical aspects of the embodiments disclosed in the present specification will be briefly described as follows.

A silicon carbide substrate according to an embodiment includes: a first substrate having a predetermined conductive type and containing silicon carbide; a first semiconductor layer having the conductive type and containing silicon carbide, on the first substrate; a second semiconductor layer having the conductive type and containing silicon carbide, on the first semiconductor layer; and a third semiconductor layer having the conductive type and containing silicon carbide, on the second semiconductor layer. The first semiconductor layer is in contact with an upper surface of the first substrate. A first impurity concentration of the first semiconductor layer is lower than both a second impurity concentration of the second semiconductor layer and a fourth impurity concentration of the upper surface of the first substrate. The second impurity concentration N2 [cm$^{-3}$], a thickness W2 [μm] of the second semiconductor layer and a rated voltage Vn [V] of an element formed on the silicon carbide substrate satisfy a condition expressed by the following equation (1);

$$W2 \geq (-2.69 \times 10^{12} \ln(Vn) + 2.22 \times 10^{13}) N2^{-0.65} \tag{1}$$

In the silicon carbide substrate according to the embodiment, the first impurity concentration is higher than $1 \times 10^{16}$ cm$^{-3}$ and equal to or lower than $1 \times 10^{17}$ cm$^{-3}$.

In the silicon carbide substrate according to the embodiment, a thickness of the first semiconductor layer is equal to or larger than 0.5 μm and equal to or smaller than 2 μm.

A silicon carbide substrate according to an embodiment includes: a first substrate having a predetermined conductive type and containing silicon carbide; a first semiconductor layer having the conductive type and containing silicon carbide, on the first substrate; a second semiconductor layer having the conductive type and containing silicon carbide, on the first semiconductor layer; and a third semiconductor layer having the conductive type and containing silicon carbide, on the second semiconductor layer. The first semiconductor layer is in contact with an upper surface of the first substrate. A first impurity concentration of the first semiconductor layer is lower than both a second impurity concentration of the second semiconductor layer and a fourth impurity concentration of the upper surface of the first substrate. The second impurity concentration N2 [cm$^{-3}$], a thickness W2 [µm] of the second semiconductor layer and a rated voltage Vn [V] of an element formed on the silicon carbide substrate satisfy a condition expressed by the following equation (2);

$$W2 \geq (-2.53 \times 10^{12} \ln(Vn) + 2.16 \times 10^{13})N2^{-0.65} \qquad (2).$$

In the silicon carbide substrate according to the embodiment, the first impurity concentration is higher than $1 \times 10^{16}$ cm$^{-3}$ and equal to or lower than $1 \times 10^{17}$ cm$^{-3}$.

In the silicon carbide substrate according to the embodiment, a thickness of the first semiconductor layer is equal to or larger than 0.5 µm and equal to or smaller than 2 µm.

A silicon carbide substrate according to an embodiment includes: a first substrate having a predetermined conductive type and containing silicon carbide; a first semiconductor layer having the conductive type and containing silicon carbide, on the first substrate; a second semiconductor layer having the conductive type and containing silicon carbide, on the first semiconductor layer; and a third semiconductor layer having the conductive type and containing silicon carbide, on the second semiconductor layer. The first semiconductor layer is in contact with an upper surface of the first substrate. A first impurity concentration of the first semiconductor layer is lower than both a second impurity concentration of the second semiconductor layer and a fourth impurity concentration of the upper surface of the first substrate. The second impurity concentration N2 [cm$^{-3}$], a thickness W2 [µm] of the second semiconductor layer and the maximum current density J [A/cm$^2$] in usage of an element formed on the silicon carbide substrate satisfy a condition expressed by the following equation (3);

$$W2 \geq (2.52 \times 10^{12} \ln(J) - 1.31 \times 10^{13})N2^{-0.65} \qquad (3).$$

In the silicon carbide substrate according to the embodiment, the first impurity concentration is higher than $1 \times 10^{16}$ cm$^{-3}$ and equal to or lower than $1 \times 10^{17}$ cm$^{-3}$.

In the silicon carbide substrate according to the embodiment, a thickness of the first semiconductor layer is equal to or larger than 0.5 µm and equal to or smaller than 2 µm.

A method of manufacturing a silicon carbide substrate according to an embodiment includes: a step (a) of preparing a first substrate having a predetermined conductive type and containing silicon carbide; a step (b) of forming a first epitaxial layer having the conductive type and containing silicon carbide, formed on the first substrate; a step (c) of forming a second epitaxial layer having the conductive type and containing silicon carbide, formed on the first epitaxial layer; and a step (d) of forming a third epitaxial layer having the conductive type and containing silicon carbide, formed on the second epitaxial layer. A first impurity concentration of the first epitaxial layer is lower than both a second impurity concentration of the second epitaxial layer and a fourth impurity concentration of the upper surface of the first substrate. The second impurity concentration N2 [cm$^{-3}$], a thickness W2 [µm] of the second epitaxial layer and a rated voltage Vn [V] of an element formed on the silicon carbide substrate satisfy a condition expressed by the following equation (1);

$$(W2 \geq (-2.69 \times 10^{12} \ln(Vn) + 2.22 \times 10^{13})N2^{-0.65} \qquad (1).$$

A method of manufacturing a silicon carbide substrate according to an embodiment includes: a step (a) of preparing a first substrate having a predetermined conductive type and containing silicon carbide; a step (b) of forming a first epitaxial layer having the conductive type and containing silicon carbide, formed on the first substrate; a step (c) of forming a second epitaxial layer having the conductive type and containing silicon carbide, formed on the first epitaxial layer; and a step (d) of forming a third epitaxial layer having the conductive type and containing silicon carbide, formed on the second epitaxial layer. A first impurity concentration of the first epitaxial layer is lower than both a second impurity concentration of the second epitaxial layer and a fourth impurity concentration of the upper surface of the first substrate. The second impurity concentration N2 [cm$^{-3}$], a thickness W2 [µm] of the second epitaxial layer and the maximum current density J [A/cm$^2$] in usage of an element formed on the silicon carbide substrate satisfy a condition expressed by the following equation (3);

$$(W2 \geq (2.52 \times 10^{12} \ln(J) - 1.31 \times 10^{13})N2^{-0.65} \qquad (3).$$

According to a typical embodiment, reliability of the silicon carbide semiconductor substrate can be improved.

BRIEF DESCRIPTIONS OF THE DRAWINGS

Figure 20:
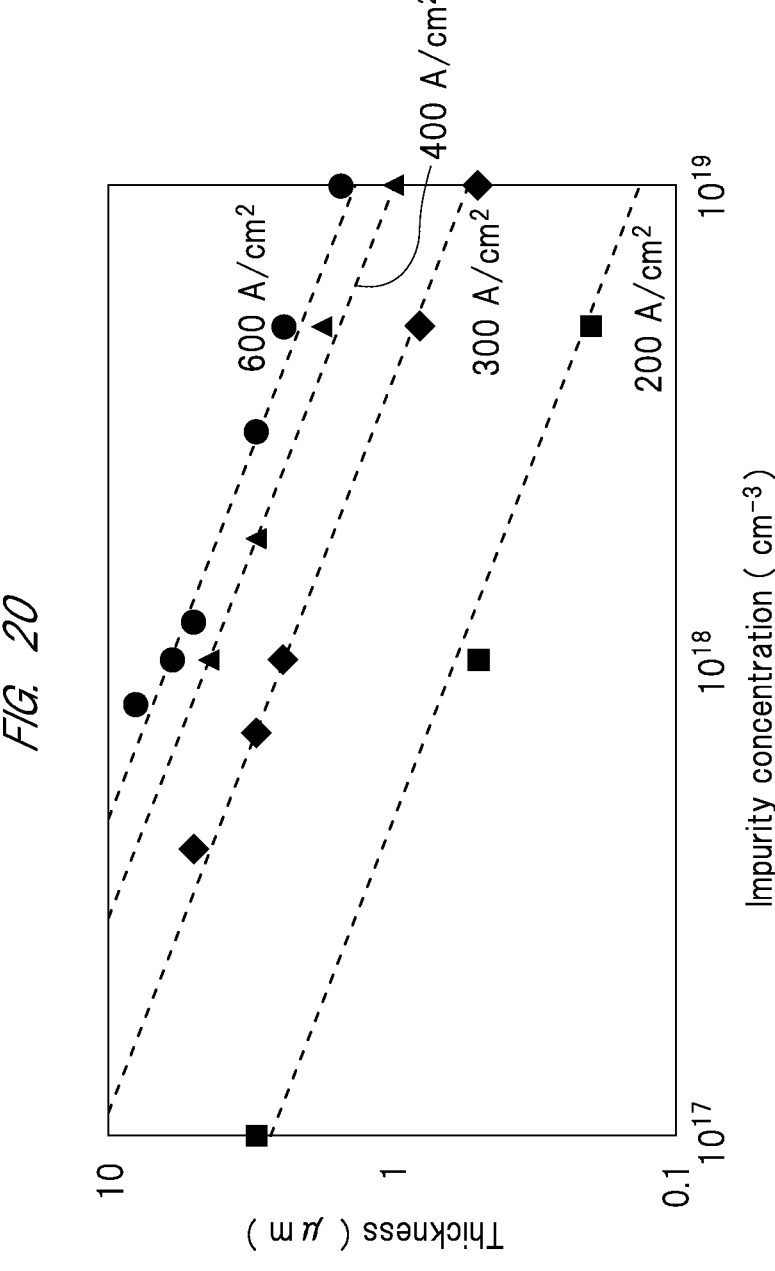
Figure 21:
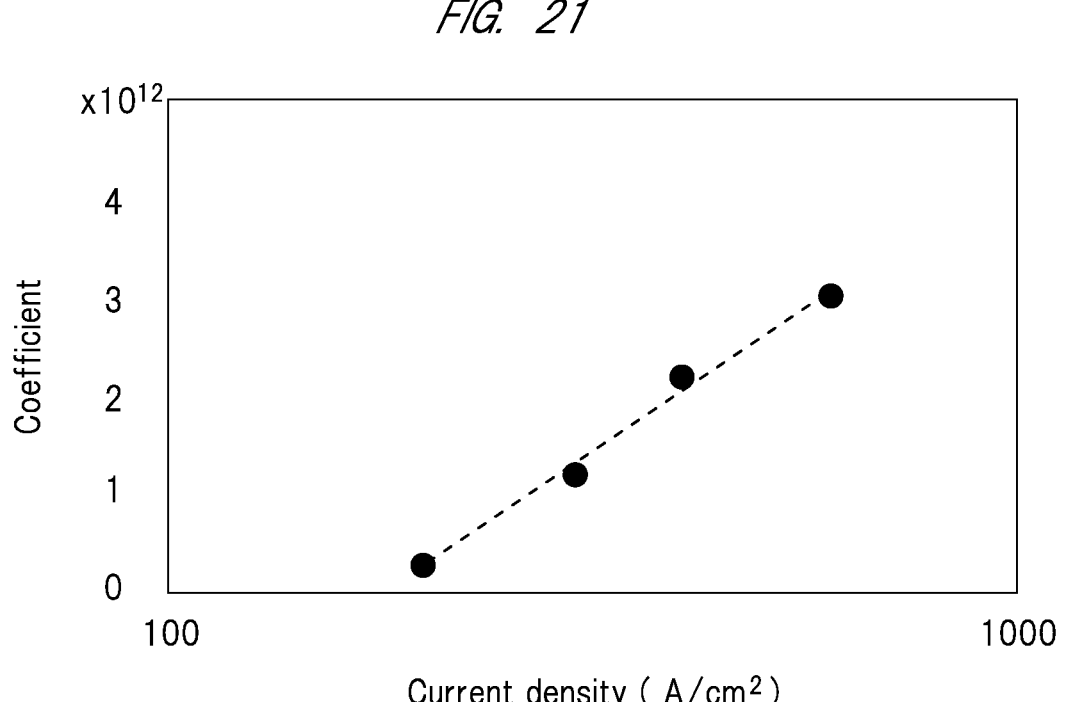

FIG. 20 is a graph showing a relation between an impurity concentration and a thickness of a second semiconductor layer of a silicon carbide substrate according to a third embodiment of the present invention; and FIG. 21 is a graph showing a relation between a current density and a coefficient defining the relation between the impurity concentration and the thickness of the second semiconductor layer of the silicon carbide substrate according to the third embodiment of the present invention.

DETAILED DESCRIPTION

Hereinafter, embodiments of the present invention will be described in detail with reference to the accompanying drawings. Note that components having the same function are denoted by the same reference signs throughout all the drawings for describing the embodiments, and the repetitive description thereof will be omitted. In the embodiments, the explanation for the same or similar portions will be not repeated in principle unless otherwise particularly required.

Signs "−" and "+" represent relative concentrations of "n"-type and "p"-type conductivity types, respectively. For example, in the case of the n-type impurity, the impurity concentrations increase in an order of "n$^{---}$", "n$^{--}$", "n$^{-}$", "n", "n$^{+}$" and "n$^{++}$".

The substrate described in the present specification means a semiconductor substrate not including an epitaxial layer or a substrate including a stacking structure including a semiconductor substrate and an epitaxial layer on the semiconductor substrate. When a "SiC substrate", a "semiconductor substrate" or a "SiC semiconductor substrate" is simply mentioned in the following embodiments, each of these substrates means the substrate not including the epitaxial layer. On the other hand, when a "silicon carbide substrate" is simply mentioned in the following embodiments, this substrate means the stacking substrate including the semiconductor substrate and the epitaxial layer on the semiconductor substrate. The first embodiment will be mainly explained below. When the "present embodiment" is mentioned in the present specification, this means the first embodiment. However, FIGS. 16 and 17, description for these drawings and an equation (2) are applied to the second embodiment. A modification example described later is applicable to both the first and second embodiments.

First Embodiment

<Configuration of Silicon Carbide Substrate>

Figure 1:
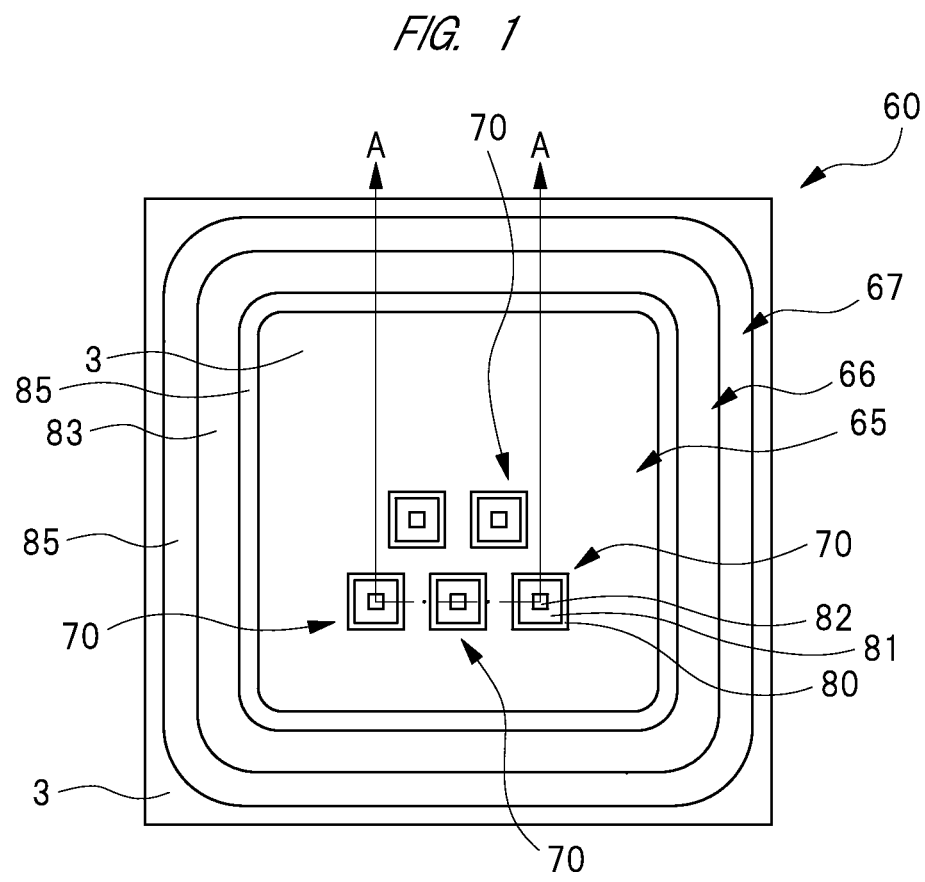
FIG. 1 is a plan view at a stage of formation of a unit cell made of a semiconductor chip using a silicon carbide substrate according to a first embodiment of the present invention.
Figure 2:
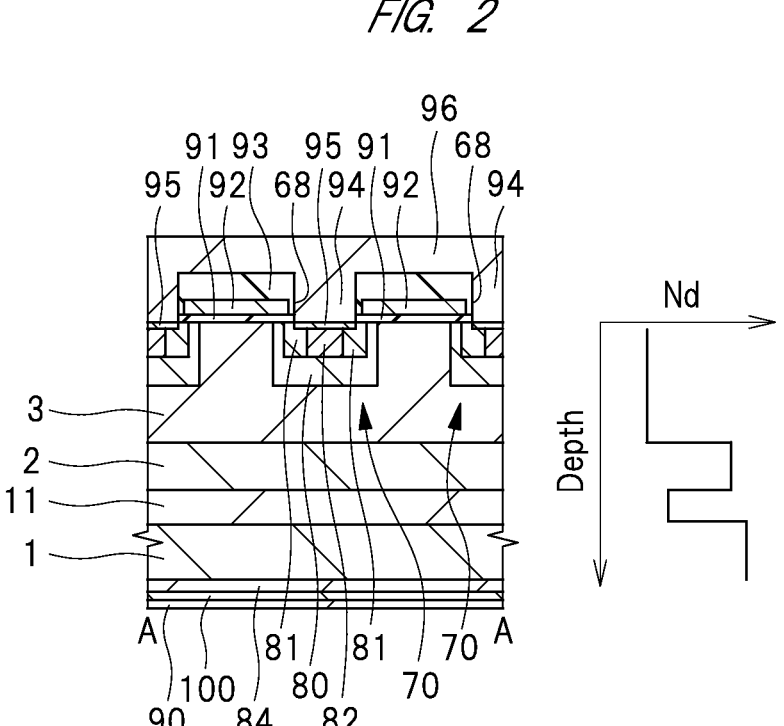
FIG. 2 is a cross-sectional view of the semiconductor chip taken along a line A-A of FIG. 1.
Figure 3:
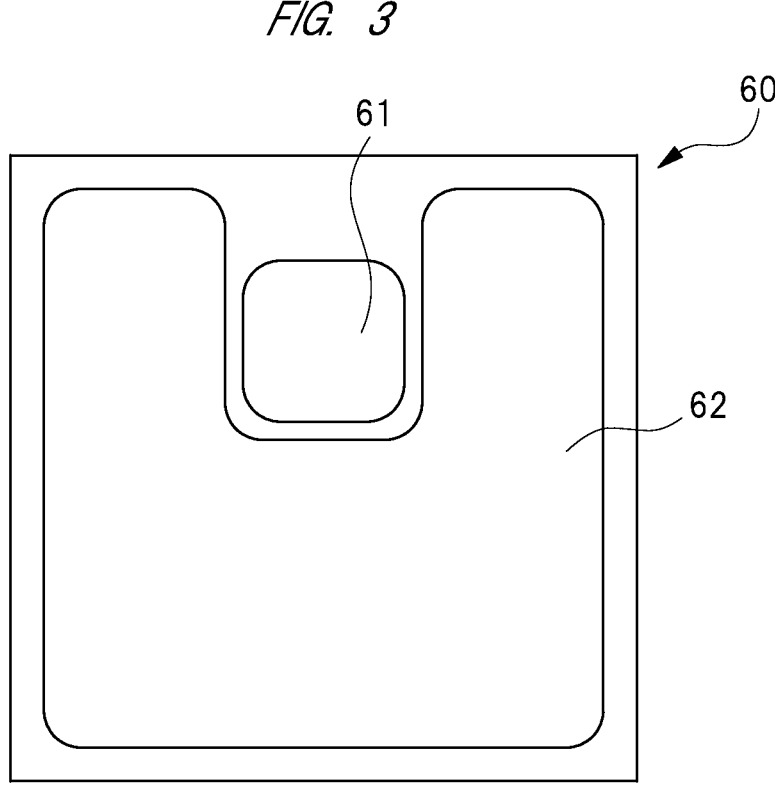
FIG. 3 is a plan view of the semiconductor chip using the silicon carbide substrate according to the first embodiment of the present invention.

A structure of the semiconductor chip using the silicon carbide substrate according to the present embodiment will be explained below with reference to FIGS. 1 to 3. FIG. 1 is a plan view at a stage of formation of a unit cell 70 made of the semiconductor chip using the silicon carbide substrate according to the present embodiment. FIG. 2 is a cross-sectional view of the semiconductor chip taken along a line A-A of FIG. 1. FIG. 3 is a plan view of the semiconductor chip using the silicon carbide substrate according to the present embodiment, and shows a pad formation layer upper than a region where a plurality of elements shown in FIG. 1 are formed.

As shown in FIG. 1, a semiconductor chip 60 includes a drift layer 3 that is an epitaxial layer formed on the semiconductor substrate to be close to a surface of the semiconductor substrate. FIG. 1 mainly shows an upper surface of the drift layer 3, and illustrations for a gate insulating film, a gate electrode, an interlayer insulating film, a silicide layer, a contact plug, a passivation film, a pad and others are omitted. FIG. 1 shows the upper surface of the drift layer 3 and various semiconductor regions formed on the upper surface.

A left side of FIG. 2 shows a cross-sectional view taken along the line A-A of FIG. 1, and shows a structure of an element region at the center of the semiconductor chip 60 (see FIGS. 1 and 3) including a SiC (silicon carbide) MOSFET (Metal Oxide Semiconductor Field Effect Transistor). In other words, the cross-sectional view on the left side of FIG. 2 shows a cross section of the plurality of SiC MOSFET (simply referred to as MOSFET below) in an active region of the semiconductor chip 60.

A right side of FIG. 2 shows a graph of a relation between an impurity concentration and a depth direction of the cross-sectional structure on the left side of FIG. 2. In other words, a horizontal axis of this graph indicates an impurity concentration "Nd" (that is an n-type impurity concentration in this case), and a vertical axis of the same indicates a depth. The depth described here means a depth from an upper surface to a lower surface of the stacking structure including a SiC substrate (semiconductor substrate, semiconductor layer) 1, a first semiconductor layer (basal-plane-dislocation conversion layer, epitaxial layer) 11, a second semiconductor layer (epitaxial layer) 2 and the drift layer (semiconductor layer, epitaxial layer) 3 configuring the semiconductor chip 60. The depth means a distance extending downward in a direction perpendicular to a principal surface of the SiC substrate 1. This graph shows only each impurity concentration of the SiC substrate 1, the first semiconductor layer 11, the second semiconductor layer 2 and the drift layer 3, and does not show each impurity concentration of portions where other contact regions, a well region, a source region, a drain region and others are formed.

The SiC substrate 1 is an n$^{++}$-type hexagonal-system semiconductor substrate, and each of the SiC substrate 1, the first semiconductor layer 11, the second semiconductor layer 2 and the drift layer 3 is made of the n-type semiconductor made of SiC (silicon carbide). The silicon carbide substrate of the present embodiment is made of the stacking structure including the SiC substrate 1, the first semiconductor layer 11, the second semiconductor layer 2 and the drift layer 3 configuring the semiconductor chip 60.

Note that the silicon carbide substrate described in the present specification does not mean only a disk-shaped substrate obtained before the dicing but also means a substrate configuring the semiconductor chip resulted from the dicing step after the formation of the element in the epitaxial layer on the substrate.

As shown in FIG. 1, the plurality of MOSFETs made of the cell structure are mounted on the silicon carbide substrate of the present embodiment, and the diced silicon carbide substrate configures the semiconductor chip 60. Each pad used for power supply to a gate electrode (not illustrated) and a source region 81 configuring each MOSFET is illustrated in FIG. 3.

As shown in FIG. 3, a gate pad 61 to which a gate voltage is applied from an external control circuit (not illustrated) is formed on an upper surface of the semiconductor chip 60. The gate pad 61 is electrically connected to a gate electrode 92 (see FIG. 2) configuring the MOSFET. Respective source regions of the plurality of MOSFETs formed in the semiconductor chip 60 are electrically connected in parallel, and are connected to a source pad 62. In other words, one source pad 62 is electrically connected to the plurality of source regions.

A plurality of unit cells 70 becoming the minimum unit structure of the MOSFET are arranged in an element region (active region) 65 at the center of the semiconductor chip 60 shown in FIG. 1. The gate voltage applied to the gate pad 61 shown in FIG. 3 is supplied to the gate electrode (not illustrated) of each unit cell 70 through the gate pad 61. Note that a wide variety of positions and numbers of the gate pad 61 shown in FIG. 3, a wide variety of shapes of the source pad 62 and others can be exemplified. However, the variations do not affect effects of the silicon carbide substrate of the present embodiment.

As shown in FIG. 1, the semiconductor chip 60 has a quadrangular shape in a plan view. In the plan view, an element region 65 exists at the center of the semiconductor chip 60, and an edge region 66 and a termination region 67 exist to surround the periphery of the element region 65. In other words, in the plan view, the element region 65, the edge region 66 and the termination region 67 exist in this order from the center of the upper surface of the drift layer 3 on the semiconductor substrate configuring the semiconductor chip 60 toward an end of the upper surface of the drift layer 3.

Note that the termination region 67 is a region including the edge region 66. The edge region 66 is a power supply portion used for power supply to a JTE (Junction Termination Extension) region 85 formed in the termination region 67. Each of the edge region 66 and the termination region 67 has an annular structure extending along each side of the quadrangular semiconductor chip 60. The JTE region 85 is a p-type semiconductor region formed in the upper surface of the drift layer 3.

A plurality of the unit cells 70 made of a well region 80, a source region 81 and a first contact region 82 are arranged in the element region 65 that is the region surrounded by the edge region 66. The unit cell 70 is the minimum unit structure of the MOSFET. In the upper surface of the drift layer 3, the plurality of unit cells 70 separate from one another. In a plan view, inside each unit cell 70, the source region 81 and the well region 80 are sequentially arranged around the first contact region 82 to put the first contact region 82 as its center.

In other words, in a plan view, the source region 81 is formed to surround an outer side of the first contact region 82, and besides, the well region 80 is formed to surround an outer side of the source region 81. In a plan view, each of the first contact region 82, the source region 81 and the well region 80 has a quadrangular shape.

The first contact region 82 and the source region 81 are adjacent to each other, and a silicide layer 95 (see FIG. 2) is formed on upper surfaces of the first contact region 82 and the source region 81 to be over a boundary between the first contact region 82 and the source region 81.

In this case, the unit cell 70 is described to have a square shape structure in a plan view. However, the shape is not limited to this, and the shape of the unit cell 70 may be, for example, a rectangular shape, a polygonal shape or others. FIG. 1 shows only five unit cells 70. However, more unit cells 70 are practically arranged inside the element region 65.

In this case, the plurality of unit cells 70 are arranged in a first direction in parallel to two parallel sides of an end of the semiconductor chip 60, and a plurality of rows that are formed as described above are arranged in a direction orthogonal to the first direction. Further, the unit cells 70 of the rows that are adjacent in the second direction are alternately arranged to shift from each other by a half cycle in the first direction. However, the arrangement is not limited to this, and the plurality of unit cells 70 may be vertically and horizontally arranged to separate from each other by an equal pitch. In other words, the plurality of unit cells 70 may be arranged in a matrix form.

Inside the edge region 66, an annular second contact region 83 is formed in the upper surface of the drift layer 3. The edge region 66 described here means a region overlapping the second contact region 83 in a plan view. In other words, a layout of the edge region 66 is defined by the formation region of the second contact region 83. The second contact region 83 is a p$^+$-type semiconductor region formed in the upper surface of the drift layer 3. The second contact region 83 is a region formed for fixing a potential of the termination region 67 as well as a region for power supply to the JTE region 85.

Electric field concentration in a termination region at the time of the backward voltage application is moderated by application of a potential to the JTE region 85 through the second contact region 83, and therefore, the dielectric withstand voltage of the semiconductor chip can be highly held. In this case, a structure with formation of the JTE region will be explained as the termination structure of the semiconductor chip. However, in order to moderate the electric field of the semiconductor chip, the termination structure may be, for example, a FLR (Field Limiting Ring) structure including a plurality of p-type semiconductor regions annularly surrounding the element region in a plan view.

As shown in FIG. 2, the semiconductor chip 60 of the present embodiment (see FIG. 1) includes the SiC substrate 1 that is the n$^{++}$-type hexagonal-system semiconductor substrate. On the SiC substrate 1, the n$^-$-type first semiconductor layer 11 made of SiC having an impurity concentration lower than that of the SiC substrate 1 is formed. On the first semiconductor layer 11, the n$^+$-type second semiconductor layer 2 having an impurity concentration higher than that of the first semiconductor layer 11 is formed. On the second semiconductor layer 2, the n$^{--}$-type drift layer 3 made of SiC having an impurity concentration lower than that of the first semiconductor layer 11 is formed.

Each of the SiC substrate 1, the first semiconductor layer 11, the second semiconductor layer 2 and the drift layer 3 contains an n-type impurity (such as nitrogen (N) or phosphorus (P)). The impurity concentration of each of the SiC substrate 1, the first semiconductor layer 11, the second semiconductor layer 2 and the drift layer 3 means a concentration of the n-type impurity. In the element region, a plurality of n-channel-type MOSFET cell structures are formed in the upper surface of the drift layer 3.

As shown in the graph on the right side of FIG. 2, a scale relation in the impurity concentration is expressed as "the SiC substrate 1, the second semiconductor layer 2>the first semiconductor layer 11>the drift layer 3". The scale relation in the impurity concentration between the SiC substrate 1 and the second semiconductor layer 2 is not defined. However, the principal feature of the present embodiment is to form the first semiconductor layer (basal-plane-dislocation conversion layer) 11 having the impurity concentration lower than that of the SiC substrate 1, on the SiC substrate 1 having the high concentration to be in contact with the principle surface of the SiC substrate 1, and to set the impurity concentration N2 of the second semiconductor layer formed on the first semiconductor layer 11, the thickness W2 of the second semiconductor layer and the rated voltage Vn of the element to satisfy the relation expressed by the following equation (1).

$$W2 \geq (-2.69 \times 10^{12} \ln(Vn) + 2.22 \times 10^{13}) N2^{-0.65} \qquad (1).$$

Note that the coefficient described in the present specification is a term multiplied by N2 in the equation (1), in other words, a term of "$-2.69 \times 10^{12} \ln(Vn) + 2.22 \times 10^{13}$". The rated voltage is set to have a margin for the input voltage for each application, and is, for example, 1700 V, 3300 V, 6500 V or others in application to rail vehicles, or 600 V, 1200 V or others in application to automobiles. In the case of the MOSFET, a breakdown voltage when the voltage is applied between the source and the drain electrode in an OFF state in which 0 V or a negative voltage is applied to the gate is designed and manufactured to be equal to or higher than the rated voltage.

As another feature of the present embodiment, the impurity concentration of the first semiconductor layer 11 is higher than the impurity concentration of the drift layer 3, the upper surface of which includes the element. In FIG. 2, the impurity concentration of the second semiconductor layer 2 is illustrated to be constant in the thickness direction, but may change in the thickness direction in the range satisfying the scale relation in the impurity concentration. In this case, the average concentration is regarded as N2.

The n-type impurity concentration of the SiC substrate 1 is, for example, higher than $1 \times 10^{18}$ cm$^{-3}$ and equal to or lower than $1 \times 10^{19}$ cm$^{-3}$. The principal surface of the SiC substrate 1 has, for example, a {0001} plane tilting in <11-20> direction by 4 to 8 degrees. For example, the thickness of the first semiconductor layer 11 is several hundred nm to 2 μm. The n-type impurity concentration of the first semiconductor layer 11 is, for example, higher than $1 \times 10^{16}$ cm$^{-3}$ and equal to or lower than $1 \times 10^{17}$ cm$^{-3}$. The thickness of the second semiconductor layer 2 is, for example, equal to or larger than 0.5 μm, the n-type impurity concentration of the second semiconductor layer 2 is equal to or higher than $1 \times 10^{17}$ cm$^{-3}$, and therefore, the equation (1) is satisfied. The thickness of the drift layer 3 is, for example, 3 to 120 μm. The n-type impurity concentration of the drift layer 3 can be optionally set based on a specification of a power device formed above the drift layer 3, and is, for example, equal to or higher than $1 \times 10^{14}$ cm$^{-3}$ and lower than $5 \times 10^{16}$ cm$^{-3}$.

The numerical values of the respective impurity concentrations of the substrate and the semiconductor layers exemplified here have an overlapping range. However, regarding the scale relation in the impurity concentrations of the silicon carbide substrate of the present embodiment, "SiC substrate 1>First semiconductor layer 11>Drift layer 3" is preferable. For example, if the impurity concentration of the drift layer 3 is $2 \times 10^{16}$ cm$^{-3}$, the impurity concentration of the first semiconductor layer 11 is definitely higher than $2 \times 10^{16}$ cm$^{-3}$.

A drain wiring electrode 90 of the MOSFET is formed to be close to a back surface that is opposite to the principal surface of the semiconductor chip 60 (see FIG. 1). Specifically, the back surface of the SiC substrate 1 includes a drain region 84 that is an n-type semiconductor region having a higher impurity concentration than that of the SiC substrate 1, and is in contact with a bottom surface of the drain region 84 to form a third silicide layer 100. In other words, the back surface of the SiC substrate 1 is covered with the third silicide layer 100. The bottom surface of the third silicide layer 100, that is an opposite surface to the SiC substrate 1, is covered with the drain wiring electrode 90.

In the element region, a plurality of the well regions 80 that are p-type semiconductor regions are formed to have a predetermined depth from the upper surface of the drift layer 3. The well region 80 is a semiconductor region doped with a p-type impurity (such as aluminum (Al) or boron (B)). Inside each well region 80, the source region 81 that is an n$^+$-type semiconductor region is formed to have a predetermined depth from the upper surface of the drift layer 3. The source region 81 is a semiconductor region doped with an n-type impurity (such as nitrogen (N) or phosphorus (P)).

Inside each well region 80, the first contact region 82 that is a p$^+$-type semiconductor region is formed to have a predetermined depth from the upper surface of the drift layer 3. The first contact region 82 is a region for fixing the potential of the well region, and has the almost same depth as that of the source region 81. The first contact region 82 is a semiconductor region doped with a p-type impurity (such as aluminum (Al) or boron (B)). Both sides of the first contact region 82 are sandwiched by the adjacent source regions 81. A bottom portion of the first contact region 82 and a bottom portion and a side surface of the source region 81 are covered with the well region 80.

A plurality of the unit cells 70 each made of the well region 80, the source region 81 and the first contact region 82 are formed on the upper surface of the drift layer 3, and the unit cells 70 separate from one another. A gate electrode 92 is formed above the drift layer 3 so as to put the gate insulating film 91 therebetween, the drift layer 3 being between the adjacent unit cells 70. An upper surface of an end of the gate insulating film 91 and a side surface and an upper surface of the gate electrode 92 are covered with the interlayer insulating film 93. In an opening 68 between the interlayer insulating films 93 covering each gate electrode 92, the first contact region 82 and the source region 81 are not covered with the gate insulating film 91, the gate electrode 92 and the interlayer insulating film 93. In other words, the gate insulating film 91, the gate electrode 92 and the interlayer insulating film 93 have the opening 68 reaching the upper surface of the unit cell 70, and the source region 81 and the first contact region 82 are exposed out at a bottom of the opening 68.

A silicide layer 95 is formed on a partial surface of the source region 81 and a surface of the first contact region 82 exposed out at the opening 68 of the interlayer insulating film 93, that is the bottom in the contact hole, in the element region. A contact plug 94 that is a connecting portion is buried in the opening 68 on the silicide layer 95 in contact with a part of the source region 81 and the first contact region 82. Each of the plurality of contact plugs 94 buried in the plurality of openings 68 is unified with a source wiring electrode 96 formed in the interlayer insulating film 93. The source wiring electrode 96 is electrically connected to the source pad 62 (see FIG. 3). In this case, an upper surface itself of the source wiring electrode 96 exposed out from a passivation film (not illustrated) covering the termination region configures the source pad 62.

A part of the source region 81 and the first contact region 82 are electrically connected to the contact plug 94 through the silicide layer 95 to have ohmic characteristics. Therefore, the part of the source region 81 and the first contact region 82 are connected to the source pad 62 through the silicide layer 95, the contact plug 94 and the source wiring electrode 96. Similarly, a contact plug is connected to the gate electrode 92 in a not-illustrated region, and the gate electrode 92 is electrically connected to the gate pad 61 (see FIG. 3) through this contact plug and a gate wiring electrode.

The MOSFET formed in the semiconductor chip of the present embodiment includes at least the gate electrode 92, the source region 81 and the drain region 84. In order to operate the MOSFET, electric current is flown from the drain having the high potential to the source having the low potential by application of a predetermined voltage to the gate electrode 92 to turn ON the MOSFET. A channel region of this MOSFET is formed in an upper portion of the inside of the well region 80 that is the p-type semiconductor region. In other words, the electric current used for operating the MOSFET flows from the drain wiring electrode 90 through a region near the gate insulating film 91 inside the drift layer 3 and through a region immediately below the gate electrode 92 inside the well region 80 near the upper surface of the drift layer 3 toward the source region 81.

In the present embodiment, when the potential is supplied to the first contact region 82, p-n electric current flows in a p-n junction of an embedded diode (embedded p-n diode) of the MOSFET. When the potential is supplied to the second contact region 83, p-n electric current flows in a p-n junction of an embedded diode of the termination region. The embedded diode of the MOSFET described here means, for example, a p-n junction portion between the $n^{--}$-type drift layer 3 and the p-type well region 80 connected to the $p^{+}$-type first contact region 82. The embedded diode of the termination region described here means, for example, a p-n junction portion between the $n^{--}$-type drift layer 3 and the p-type JTE region 85 (see FIG. 1) connected to the $p^{+}$-type second contact region 83 (see. FIG. 1). In the present specification, note that the electric current flowing in the p-n junction in the substrate including the drift layer 3 is referred to as p-n electric current.

<Method of Manufacturing Silicon Carbide Substrate>

The silicon carbide substrate and a method of manufacturing a semiconductor device including this substrate according to the present embodiment will be explained in an order of steps with reference to FIGS. 4 to 13. Each of FIGS. 4 to 13 is a cross-sectional view showing a step of manufacturing the semiconductor chip using the silicon carbide substrate according to the present embodiment. Each of FIGS. 4 to 13 shows a cross section of the element region where the MOSFET is formed. The cross section of the element region in FIGS. 4 to 13 is a cross section at the same position as explained with reference to FIG. 2.

Figure 4:
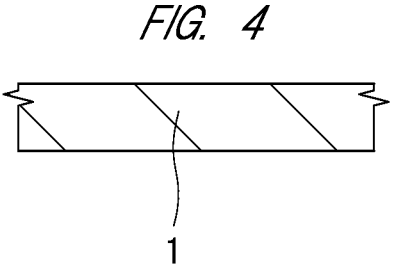
FIG. 4 is a cross-sectional view showing a manufacturing step of the semiconductor chip using the silicon carbide substrate according to the first embodiment of the present invention.

First, as shown in FIG. 4, the $n^{+}$-type SiC substrate 1 is prepared. The SiC substrate 1 is doped with the n-type impurity having a relatively high concentration. The n-type impurity is, for example, nitrogen (N), and the impurity concentration of the n-type impurity is, for example, higher than $10^{18}$ cm$^{-3}$ and equal to or lower than $1\times10^{19}$ cm$^{-3}$. The principal surface of the SiC substrate 1 has, for example, the {0001} plane tilting in <11 to 20> direction by 4 to 8 degrees. Each of the principal surface of the SiC substrate 1 and the back surface opposite to the principal surface is polished by a CMP (Chemical Mechanical Polishing) method to be a mirror surface.

Figures 5, 6:
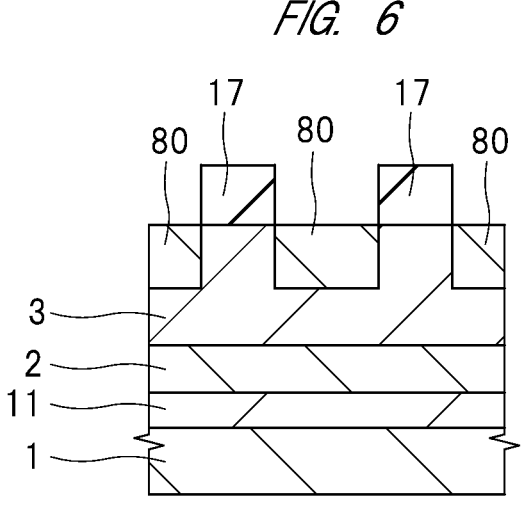
FIG. 5 is a cross-sectional view showing a manufacturing step of the semiconductor chip, continued from FIG. 4.
FIG. 6 is a cross-sectional view showing a manufacturing step of the semiconductor chip, continued from FIG. 5.

Next, as shown in FIG. 5, the first semiconductor layer 11, the second semiconductor layer 2 and the drift layer 3 are sequentially formed on the SiC substrate 1. In other words, various semiconductor layers (epitaxial layer, epitaxial growing layer) each made of SiC are sequentially formed by an epitaxial growth method as described below.

First, the SiC substrate 1 is rinsed with RCA, and then, is placed on a susceptor inside a furnace of a chemical vapor deposition (CVD) apparatus. Then, gas is evacuated from inside of the furnace until a degree of vacuum of the furnace is equal to or lower than $1\times10^{-4}$ Pa. Then, hydrogen that is carrier gas is introduced into the furnace to bring a pressure of the inside of the furnace to be about 1 to 40 kPa. This state is maintained while the hydrogen is introduced as described above until a temperature of the susceptor is stably at a set temperature. The set temperature of the susceptor is, for example, 1400 to 1700° C. Then, source gas is introduced into the furnace. Silane and propane are used as the source gas, and nitrogen is used as impurity dopant gas. By supply of such source gas, growing of the epitaxial layer made of SiC is started.

By the epitaxial growth method under optional change of gas flow rates of these gasses, the set temperature of the susceptor and the furnace pressure, the first semiconductor layer (first epitaxial layer) 11, the second semiconductor layer (second epitaxial layer) 2 and the drift layer (third epitaxial layer) 3 each having desirable impurity concentration and thickness are sequentially formed on the SiC substrate 1.

The first semiconductor layer 11 is a layer formed at the boundary between the SiC substrate 1 and the first semiconductor layer 11 for improving the conversion efficiency from the BPD to the TED. When the improvement of the conversion efficiency propagates from the layer having the high impurity concentration to the layer having the low impurity concentration, the improvement is achieved by usage of characteristics making the conversion from BPD to TED easy because of a difference of the concentration between the layers. Therefore, the first semiconductor layer 11 is formed to have the lower impurity concentration than that of the SiC substrate 1.

The n-type impurity concentration of the first semiconductor layer 11 is higher than $1\times10^{16}$ cm$^{-3}$ and equal to or lower than $1\times10^{17}$ cm$^{-3}$. In order to improve the conversion efficiency from the BPD to the TED, the impurity concentration of the first semiconductor layer 11 at the boundary between the SiC substrate 1 and the first semiconductor layer 11 is desirably low. However, the lower the concentration of the first semiconductor layer 11 is, the higher the resistance is, and therefore, the element characteristics deteriorate in the power device including the portion functioning as the electric current path between the upper surface of the epitaxial layer and the back surface of the substrate. Therefore, the impurity concentration of the first semiconductor layer 11 needs to be higher than $1\times10^{16}$ cm$^{-3}$.

The thickness of the first semiconductor layer 11 is preferably equal to or lower than 2 μm. This is for preventing the high resistance caused by the excessively large thickness since the resistance is in proportional to the thickness. However, the conversion from the BPD to the TED occurs at not only the boundary between the SiC substrate 1 and the first semiconductor layer 11, and the conversion is also caused inside the first semiconductor layer 11, and therefore, the first semiconductor layer 11 desirably has a large thickness to some extent, and the thickness is preferably equal to or larger than 0.5 μm.

The second semiconductor layer 2 needs to have a function of attenuating the minority carrier implanted from the power device formed above the drift layer 3 so that an amount of the minority carrier is sufficiently small in the second semiconductor layer 2. Therefore, the impurity concentration N2 of the second semiconductor layer 2, the thickness W2 of the second semiconductor layer and the rated voltage Vn of the element need to satisfy the relation of the equation (1).

Meanwhile, too low impurity concentration of the second semiconductor layer 2 increases the element resistance. And, too high impurity concentration of the second semiconductor layer 2 forms a lot of morphology defects in the drift layer 3 formed on the second semiconductor layer. Therefore, in this case, the n-type impurity concentration of the second semiconductor layer 2 is equal to or higher than $1 \times 10^{17}$ cm$^{-3}$ and lower than $1 \times 10^{19}$ cm$^{-3}$. The thickness of the second semiconductor layer 2 is, for example, equal to or larger than 0.5 μm.

The impurity concentration and the thickness of the drift layer 3 are optionally set based on specifications of a trial power device. The impurity concentration of the drift layer 3 is, for example, equal to or higher than $1 \times 10^{14}$ cm$^{-3}$ and lower than $5 \times 10^{16}$ cm$^{-3}$. The thickness of the drift layer 3 is, for example, 3 to 120 μm.

The flow rates of the source gas, the set temperature of the susceptor and the furnace pressure may be changed in a step of forming each of the first semiconductor layer 11, the second semiconductor layer 2 and the drift layer 3. After the formation of each layer, the film formation may be stopped once by stoppage of the supply of the source gas, and then, the next layer may be formed by start of the supply of the source gas again. In this manner, the next layer is formed after the flow rates of the source gas, the set temperature of the susceptor and the furnace pressure are stabilized, and therefore, variation in the impurity concentration and thickness of each layer can be reduced.

After the formation of all the first semiconductor layer 11, the second semiconductor layer 2 and the drift layer 3, the supply of the source gas is stopped, and the susceptor is cooled while the hydrogen is introduced into the furnace. After the temperature of the susceptor is sufficiently lowered, the introduction of the hydrogen is stopped, and the gas is evacuated from the inside of the furnace, and then, the susceptor is taken out. In this manner, the silicon carbide substrate of the present substrate is completed.

Next, a mask is formed on the upper surface of the drift layer 3 although not illustrated. The mask is a film exposing out a part of the upper surface of the drift layer 3 in the termination region. As a material of the mask, for example, SiO$_2$ (silicon oxide), a photoresist or others is used. Then, the p-type impurity (such as aluminum (Al)) is ion-implanted into the drift layer 3 in the termination region. In this manner, the JTE region (not illustrated, see the JTE region 85 in FIG. 1) that is the p-type semiconductor region is formed in the upper surface of the drift layer 3 in the termination region. The depth of the JTE region from the upper surface of the drift layer 3 is, for example, about 0.5 to 2.0 μm. The impurity concentration of the JTE region is, for example, $1 \times 10^{16}$ cm$^{-3}$ to $5 \times 10^{19}$ cm$^{-3}$.

Next, after the mask is removed, a mask 17 is formed on the upper surface of the drift layer 3 as shown in FIG. 6. The mask 17 is a film exposing out a plurality of parts of the upper surface of the drift layer 3 in the element region. A thickness of the mask 17 is, for example, about 1.0 to 5.0 μm. As a material of the mask 17, for example, SiO$_2$ (silicon oxide), a photoresist or others is used.

Next, the p-type impurity (such as aluminum (Al)) is ion-implanted into the drift layer 3, on which the mask 17 has been formed. In this manner, a plurality of the well region 80 that are the p-type semiconductor regions are formed in the upper surface of the drift layer 3 in the element region. The depth of the well region 80 from the upper surface of the drift layer 3 is, for example, about 0.5 to 2.0 μm. The impurity concentration of the well region 80 is, for example, $1 \times 10^{16}$ cm$^{-3}$ to $1 \times 10^{19}$ cm$^{-3}$.

Figures 7, 8:
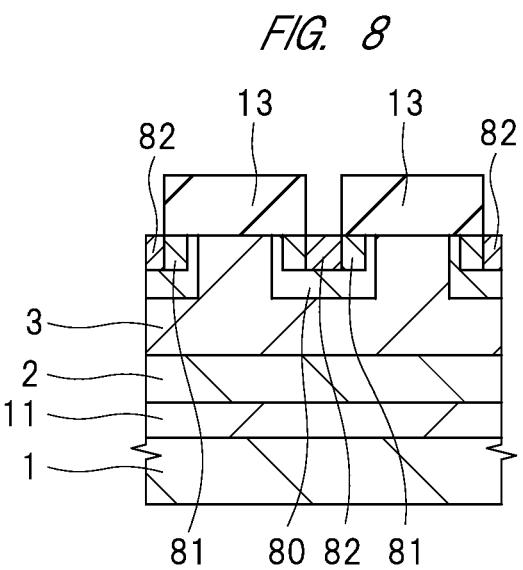
FIG. 7 is a cross-sectional view showing a manufacturing step of the semiconductor chip, continued from FIG. 6.
FIG. 8 is a cross-sectional view showing a manufacturing step of the semiconductor chip, continued from FIG. 7.

Next, as shown in FIG. 7, after the mask 17 is removed, a mask 12 is formed on the upper surface of the drift layer 3. A thickness of the mask 12 is, for example, about 0.5 to 2.0 μm. As a material of the mask 12, for example, SiO$_2$, a photoresist or others is used.

Next, the n-type impurity (such as nitrogen (N)) is ion-implanted into the drift layer 3, on which the mask 12 has been formed. In this manner, a plurality of source regions 81 that are the n$^+$-type semiconductor regions are formed in the upper surface of the drift layer 3 in the element region. Each source region 81 is formed at the center of the well region 80 in a plan view. The depth of each source region 81 from the upper surface of the drift layer 3 is, for example, about 0.05 to 1.0 μm. The impurity concentration of the source region 81 is, for example, $1 \times 10^{18}$ cm$^{-3}$ to $1 \times 10^{20}$ cm$^{-3}$.

Next, as shown in FIG. 8, after the mask 12 is removed, a mask 13 is formed on the upper surface of the drift layer 3. A thickness of the mask 13 is, for example, about 0.5 to 2.0 μm. As a material of the mask 13, for example, SiO$_2$, a photoresist or others is used.

Next, the p-type impurity (such as aluminum (Al)) is ion-implanted into the drift layer 3, on which the mask 13 has been formed. In this manner, a plurality of first contact regions 82 that are the p$^+$-type semiconductor regions are formed in the upper surface of the drift layer 3 in the element region, and the second contact region (not illustrated, see the second contact region 83 in FIG. 1) that is the p$^+$-type semiconductor region is formed in the upper surface of the drift layer 3 in the termination region. Each first contact region 82 is formed at the center of each source region 81 in a plan view. The second contact region is formed in the upper surface of the JTE region 85. In a plan view, the second contact region has a quadrangular annular shape, and is formed to surround the element region.

The depth of each of the first contact region 82 and the second contact region from the upper surface of the drift layer 3 is, for example, about 0.05 to 2.0 μm. The impurity concentration of each of the first contact region 82 and the second contact region is, for example, $1 \times 10^{18}$ cm$^{-3}$ to $1 \times 10^{20}$ cm$^{-3}$.

Figure 9:
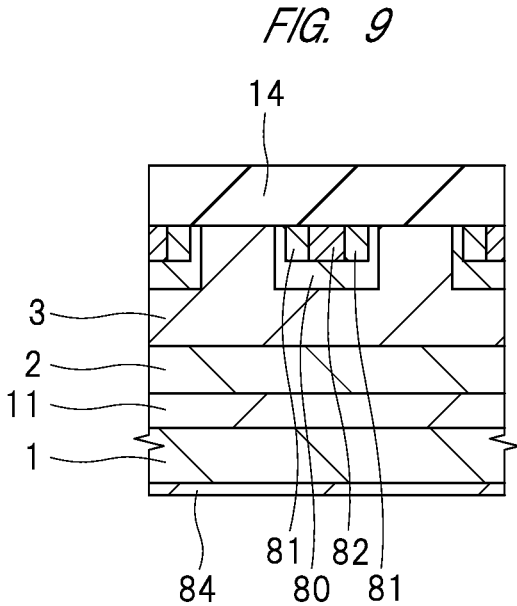
FIG. 9 is a cross-sectional view showing a manufacturing step of the semiconductor chip, continued from FIG. 8.

Next, after the mask 13 is removed, a mask 14 that is a protection film is formed on the upper surface of the drift layer 3 as shown in FIG. 9. Then, the n-type impurity (such as nitrogen (N)) is ion-implanted into the back surface of the SiC substrate 1. In this manner, the drain region 84 that is the n$^+$-type semiconductor region is formed in the back surface of the SiC substrate 1. The depth of the drain region 84 from the back surface of the SiC substrate 1 is, for example, about 0.05 to 2.0 μm. The impurity concentration of the drain region 84 is, for example, $1 \times 10^{19}$ cm$^{-3}$ to $1 \times 10^{21}$ cm$^{-3}$.

Next, although not illustrated, all masks are removed, and a carbon (C) film is deposited in contact with the upper surface of the drift layer 3 and the back surface of the SiC substrate 1 by, for example, a plasma CVD method. A thickness of the carbon (C) film is, for example, about 0.03 to 0.05 μm. After the upper surface of the drift layer 3 and the back surface of the SiC substrate 1 are covered with the carbon (C) film as described above, a heating process is performed at a temperature that is equal to or higher than 1500° C. for about two to three minutes. In this manner, each impurity ion-implanted into the upper surface of the drift layer 3 and the back surface of the SiC substrate 1 is activated. Then, the carbon (C) film is removed by, for example, a plasma process.

Figure 10:
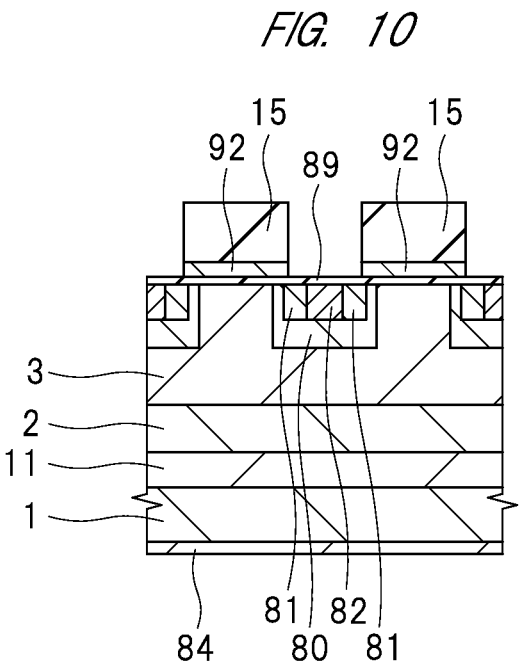
FIG. 10 is a cross-sectional view showing a manufacturing step of the semiconductor chip, continued from FIG. 9.

Next, as shown in FIG. 10, an insulating film 89 and an n-type polycrystalline Si film are sequentially formed on the upper surface of the drift layer 3, and then, a mask 15 is formed on the polycrystalline Si film. The insulating film 89 and the polycrystalline Si film are formed by, for example, a CVD method. The mask 15 is formed between the adjacent first contact regions 82 on the upper surface of the drift layer 3. Then, the polycrystalline Si film is processed by a dry etching method using the mask 15 to form a gate electrode 92 made of the polycrystalline Si film. A thickness of the insulating film 89 is, for example, about 0.05 to 0.15 μm. A thickness of the gate electrode 92 is, for example, about 0.2 to 0.5 μm.

Next, after the mask 15 is removed, an interlayer insulating film 93 is formed on the upper surface of the drift layer 3 to cover the gate electrode 92 and the insulating film 89 by, for example, a plasma CVD method. Then, the interlayer insulating film 93 and the insulating film 89 are processed by a dry etching method using the mask 16 to expose out the upper surface of the drift layer 3.

Figure 11:
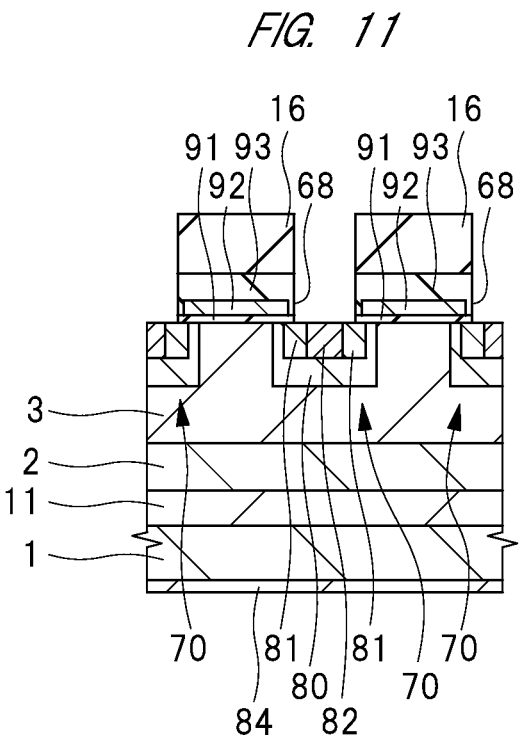
FIG. 11 is a cross-sectional view showing a manufacturing step of the semiconductor chip, continued from FIG. 10.

In this manner, as shown in FIG. 11, in the element region, the gate insulating film 91 made of the insulating film 89 is formed immediately below the gate electrode 92 and the interlayer insulating film 93. By the above-described etching process, an opening 68 exposing out each upper surface of a part of the source region 81 and the first contact region 82 is formed in the interlayer insulating film 93 in the element region, and an opening (not illustrated) exposing out a part of the upper surface of the second contact region (not illustrated) is formed in the interlayer insulating film 93 in the termination region.

In the above-described manner, the plurality of unit cells 70 each of which is the minimum unit structure of the MOSFET are formed. Each of the plurality of unit cells 70 includes the well region 80, the source region 81 and the first contact region 82 that are adjacent to one another, and the gate electrode 92 formed immediately above this well region 80 so as to put the gate insulating film 91 therebetween.

Figure 12:
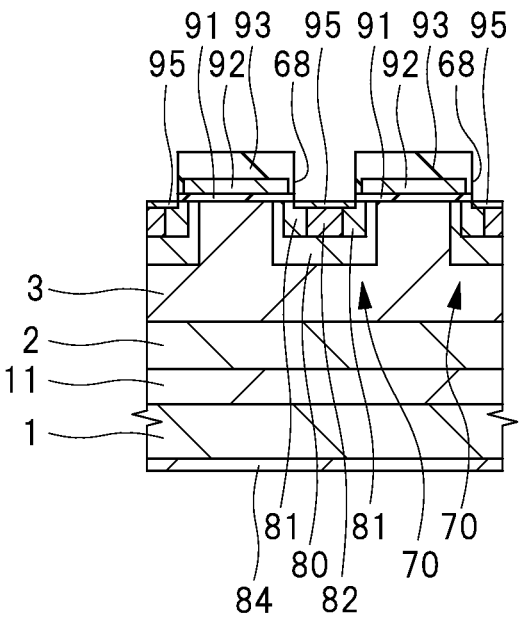
FIG. 12 is a cross-sectional view showing a manufacturing step of the semiconductor chip, continued from FIG. 11.

Next, as shown in FIG. 12, after the mask 16 is removed, the silicide layer 95 is formed in the bottom of the opening 68 in the element region, and the silicide layer (not illustrated) is formed in the bottom surface of the opening in the termination region.

When the silicide layer 95 is formed, a first metal (such as nickel (Ni)) film is deposited first to cover the exposed drift layer 3 by, for example, a sputtering method. A thickness of this first metal film is, for example, about 0.05 μm. Then, the first metal film and the drift layer 3 in the bottom surface of the opening 68 in the element region are reacted by being subjected to a silicide-formation heating process at 600 to 1000° C. to form the silicide layer 95 made of, for example, nickel silicide (NiSi). By this step, the silicide layer is also formed in the bottom surface of the opening in the termination region.

Figures 13, 14:
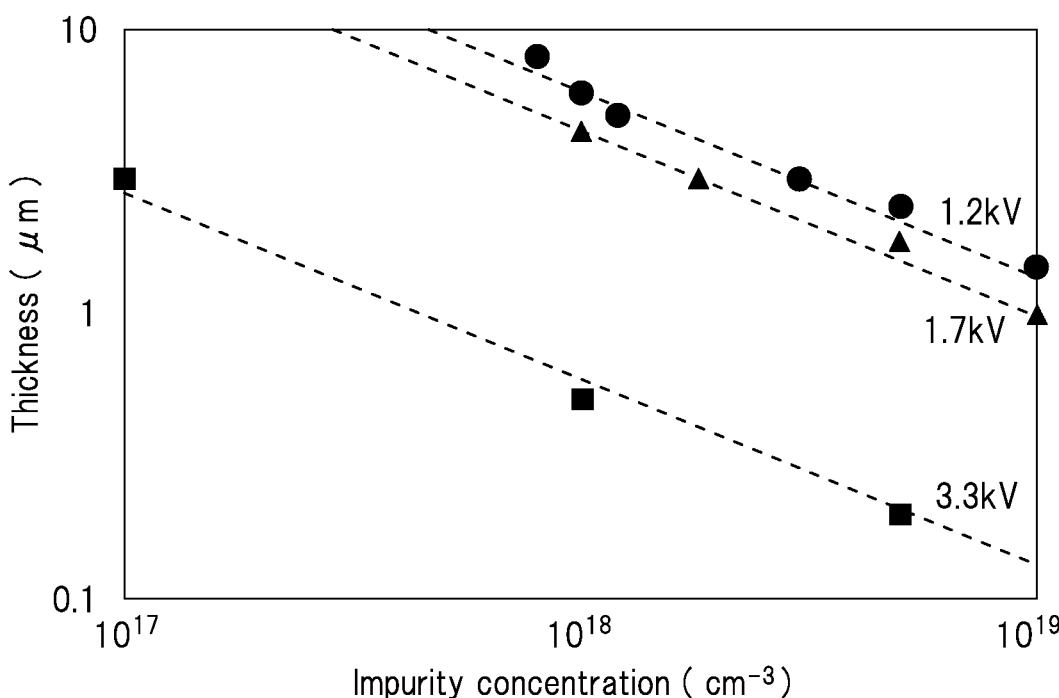
FIG. 13 is a cross-sectional view showing a manufacturing step of the semiconductor chip, continued from FIG. 12.
FIG. 14 is a graph showing a relation between an impurity concentration and a thickness of a second semiconductor layer of the silicon carbide substrate according to the first embodiment of the present invention.

Next, as shown in FIG. 13, a second metal (such as titanium (Ti)) film, a titanium nitride (TiN) film and an aluminium (Al) film are sequentially deposited on the interlayer insulating film 93 to fill each inside of the opening 68 reaching the silicide layer 95, the opening (not illustrated) reaching the silicide layer in the termination region and the opening (not illustrated) reaching the gate electrode 92. A thickness of the aluminium (Al) film is preferably, for example, equal to or larger than 1.0 μm. Then, a stacking film made of the second metal film, the titanium nitride film and the aluminium film is processed to form the contact plug 94, the source wiring electrode 96 and the gate wiring electrode (not illustrated) made of this stacking film.

The source wiring electrode 96 or the gate wiring electrode is made of this stacking film on the interlayer insulating film 93, and the contact plug 94 is made of this stacking film inside the opening 68. The source wiring electrode 96 is electrically connected to the first contact region 82 through the silicide layer 95 to have the ohmic characteristics. In the termination region not illustrated, the source wiring electrode 96 is connected to the second contact region through the silicide layer. The gate wiring electrode not illustrated is electrically connected to the gate electrode 92

Next, an insulating film made of an $SiO_2$ film or a polyimide film is formed to cover the gate wiring electrode and the source wiring electrode 96, and this insulating film is processed to form a passivation film (not illustrated). The passivation film covers the termination region, and is opened in the element region.

Next, a third metal film is deposited on the back surface of the SiC substrate 1 by, for example, a sputtering method, and the third metal film and the SiC substrate 1 are reacted by being subjected to a laser silicide-formation heating process to form a third silicide layer 100. The third silicide layer 100 is in contact with a lower surface of the drain region 84. A thickness of this third metal film is, for example, about 0.1 μm. Then, the drain wiring electrode 90 is formed to cover a bottom surface of the third silicide layer 100. The drain wiring electrode 90 is made of a stacking film of 0.5 to 1 μm formed by sequentially stacking a titanium (Ti) film, a nickel (Ni) film and a gold (Au) film in this order from the third silicide layer 100.

Then, the SiC substrate 1 is cut into pieces by a dicing step to provide a plurality of the semiconductor chips. In the above-described manner, the semiconductor chip 60 of the present embodiment including the SiC MOSFET shown in FIGS. 1, 2 and 3 is completed.

<Effect of Present Embodiment>

Figure 15:
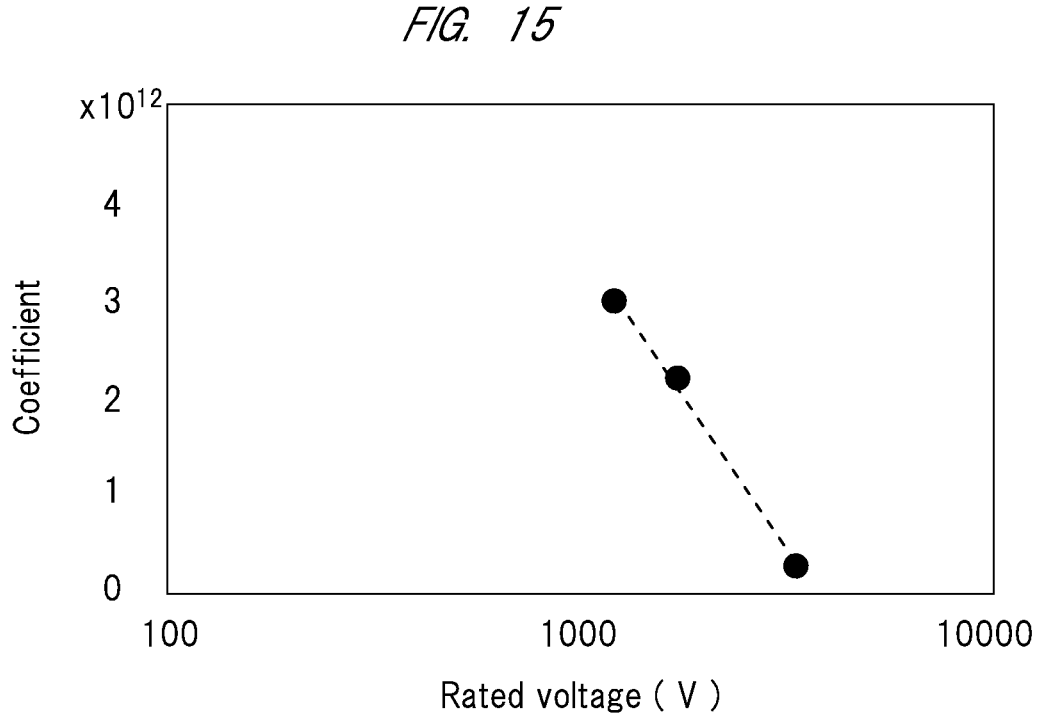
FIG. 15 is a graph showing a relation between a rated voltage and a coefficient defining the relation between the impurity concentration and the thickness of the second semiconductor layer of the silicon carbide substrate according to the first embodiment of the present invention.
Figure 16:
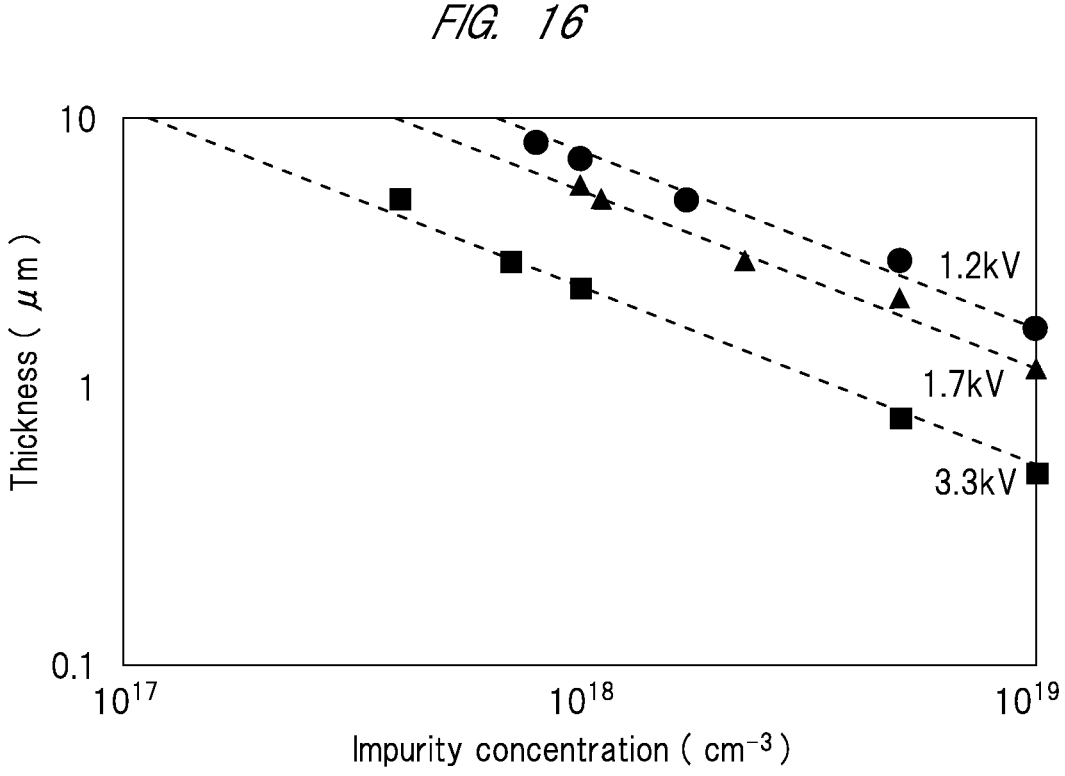
FIG. 16 is a graph showing a relation between an impurity concentration and a thickness of a second semiconductor layer of a silicon carbide substrate according to a second embodiment of the present invention.
Figure 17:
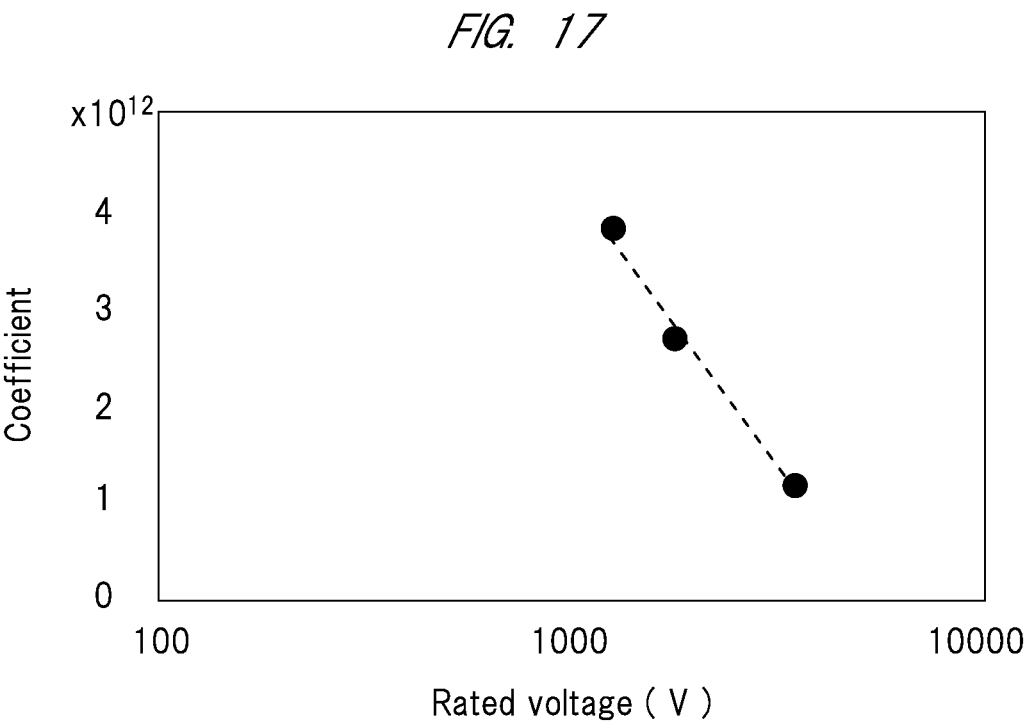
FIG. 17 is a graph showing a relation between a rated voltage and a coefficient defining the relation between the impurity concentration and the thickness of the second semiconductor layer of the silicon carbide substrate according to the second embodiment of the present invention.

Next, an effect of the silicon carbide substrate according to the present first embodiment will be explained with reference to FIGS. 14 to 17. In FIGS. 14 and 16, a plot shows data that is interpolated to be derived from practical measurement, and a broken line shows an approximate curve of a modeled plot. In FIGS. 15 and 17, a plot shows data that is sampled from the approximate curve of FIGS. 14 and 16, and a broken line shows an approximate curve of the plot. Note that FIGS. 16 and 17 are applied to a second embodiment.

A lot of BPD exist in the SiC substrate 1. When the BPDs are taken over to the drift layer 3, the BPDs are expanded to be the stacking fault by the minority carrier implanted in the general operation of the element, and, as a result, the element resistance increases. The BPD can be converted to the TED by the formation of, on the SiC substrate 1, the first semiconductor layer 11 having the largely-different impurity concentration from that of the SiC substrate 1, and therefore, the element reliability in the general operation of the element can be improved. The lower the impurity concentration of the first semiconductor layer 11 is, or the thicker the first semiconductor layer 11 is, the higher the conversion efficiency from the BPD to the TED is.

Meanwhile, the stacking fault is expanded from the substrate to increase the element resistance when the minority carriers reach the SiC substrate 1 under the circumstances such as the current surge in which more minority carriers than usual are implanted. Under such circumstances, the effect is not exerted even if the BPD in the drift layer 3 is reduced. FIG. 14 shows a graph illustrating a relation between the thickness and the impurity concentration of the second semiconductor layer 2 preventing the expansion of the stacking fault from the substrate in the element of each rated-voltage class. A vertical axis of the graph shown in FIG. 14 indicates the thickness of the second semiconductor layer 2, and a horizontal axis of the same indicates the n-type impurity concentration of the second semiconductor layer 2. FIG. 14 shows a graph relating to the rated voltage of 1.2 kV illustrated by a circle plot, a graph relating to the rated voltage of 1.7 kV illustrated by a triangle plot, and a graph relating to the rated voltage of 3.3 kV illustrated by a square plot. These graphs show that the number of the minority carriers implanted into the element can be sufficiently attenuated in the second semiconductor layer 2 if the relation between the thickness and the impurity concentration of the second semiconductor layer 2 shown in FIG. 14 is satisfied. Therefore, the thickness or the impurity concentration of the second semiconductor layer 2 in the element of each rated-voltage class is only necessarily equal to or larger than the value shown in FIG. 14.

The higher the rated-voltage class is, the larger the necessary value of the thickness or the impurity concentration of the second semiconductor layer 2 is, and therefore, a relation between the rated voltage and a coefficient of the relation between the thickness and the impurity concentration expressed by power law (Thickness $\propto$ Impurity concentration$^{-0.65}$) is illustrated as a graph shown in FIG. 15. In other words, if the equation (1) is satisfied, the expansion of the stacking fault from the substrate can be also prevented, and the long-period reliability of the element can be enhanced. A vertical axis of the graph shown in FIG. 15 indicates the coefficient, and a horizontal axis of the same indicates the rated voltage of the element. For example, "1" of the coefficient shown in the vertical axis of FIG. 15 means $1 \times 10^{12}$. This is the same in FIG. 17 used for later explanation.

Physical meaning of FIG. 14 will be explained below. The minority carriers are exponentially attenuated in time course to follow "exp(–t/relaxation time)". In relations of the time "t" regarded as "Time t=Thickness/Thermal velocity" and the relaxation time regarded as "Relaxation time=1/(Thermal velocity×Capture cross-section×Recombination-center density)", the recombination-center density in the second semiconductor layer 2 is regarded as the impurity concentration, and therefore, the minority carriers are attenuated to follow "exp(–Capture cross-section×Impurity concentration×Thickness)". In other words, the second semiconductor layer 2 satisfying a relation with a stable value of "Capture cross-section×Impurity concentration×Thickness" is a desirable structure. The capture cross-section depends on an energy level of the impurity, and the energy level of the impurity depends on the impurity density under circumstances in which the donor impurity is considered as the recombination center. In other words, the capture cross-section depends on the impurity density, and therefore, the relation with the stable value of "Capture cross-section× Impurity concentration×Thickness" can be interpreted as the relation between the impurity concentration and the thickness, and indicates the relation as shown in FIG. 14.

Circumstances in which a larger electric current than an electric current in general one element operation flows in the element include circumstances of occurrence of electric-current unbalance caused by characteristic variation among the multi-parallel connected elements. FIG. 16 shows a relation between the impurity concentration and the thickness of the second semiconductor layer 2 capable of preventing the expansion of the stacking fault from the substrate under such circumstances. A vertical axis of the graph shown in FIG. 16 indicates the thickness of the second semiconductor layer 2, and a horizontal axis of the same indicates the n-type impurity concentration of the second semiconductor layer 2. FIG. 16 shows a graph relating to the rated voltage of 1.2 kV illustrated by a circle plot, a graph relating to the rated voltage of 1.7 kV illustrated by a triangle plot, and a graph relating to the rated voltage of 3.3 kV illustrated by a square plot. A relation between the rated voltage and a coefficient of the relation between the thickness and the impurity concentration expressed by power law (Thickness $\propto$ Impurity concentration$^{-0.65}$) is illustrated in FIG. 17. A vertical axis of the graph shown in FIG. 17 indicates the coefficient, and a horizontal axis of the same indicates the rated voltage of the element. Under such circumstances, if the relation among the impurity concentration N2 [cm$^{-3}$] of the second semiconductor layer 2, the thickness W2 [μm] of the second semiconductor layer 2 and the rated voltage Vn [V] of the element satisfies the follow equation (2) derived from FIGS. 16 and 17, the long-period reliability of the element serving as the component can be further enhanced. FIGS. 16 and 17 are applied to the second embodiment. The manufacturing steps explained with reference to FIGS. 4 to 13 are applicable to manufacturing steps of the second embodiment.

$$W2 \geq (-2.53 \times 10^{12} \ln(Vn) + 2.16 \times 10^{13}) N2^{-0.65} \qquad (2).$$

<First Modification Example>

Here, the conversion efficiency from the BPD to the TED is higher as the impurity concentration of the first semiconductor layer 11 is lower than the impurity concentration of the SiC substrate 1, or as the first semiconductor layer 11 is thicker. However, when the impurity concentration of the first semiconductor layer 11 is too low or the first semiconductor layer 11 is too thick, the resistance of the first semiconductor layer 11 is large. In such a case, in the power element in which the electric current flows in the direction perpendicular to the principal surface of the SiC substrate 1 as seen in the MOSFET of FIG. 2, the resistance value between the source region 81 and the drain region 84 is large, and therefore, there is a problem of deterioration of the element characteristics.

Figure 18:
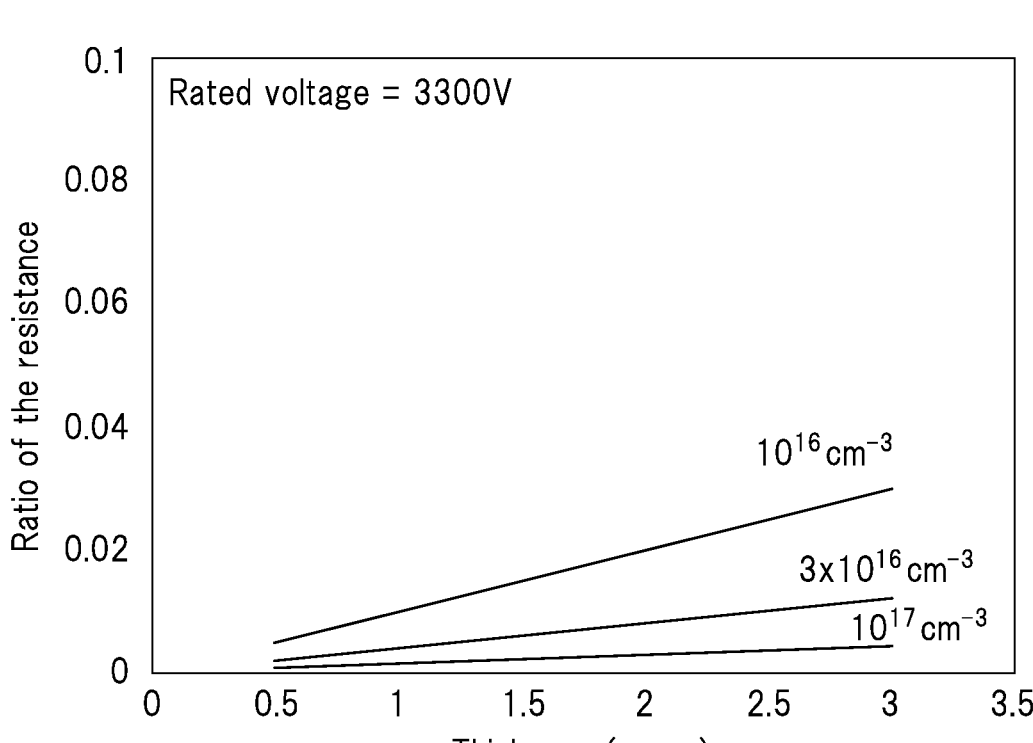
FIG. 18 is a graph showing a relation between a ratio in a resistance and a thickness of a first semiconductor layer of a silicon carbide substrate according to an embodiment of the present invention.
Figure 19:
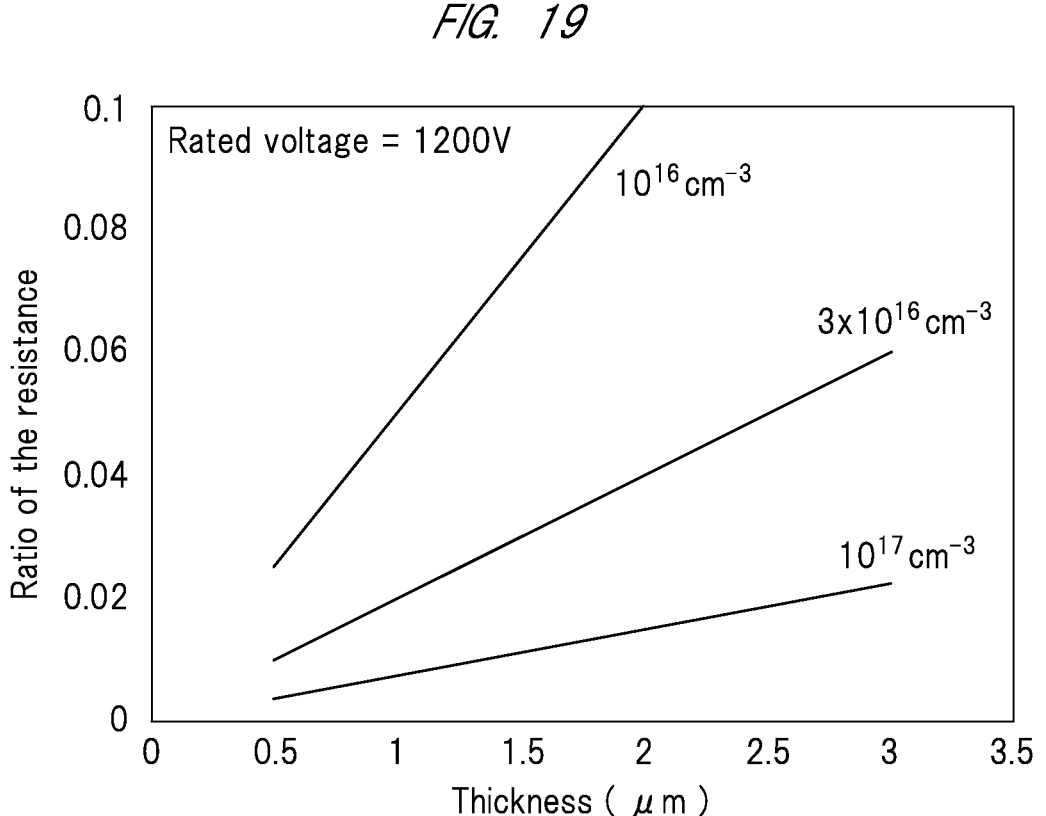
FIG. 19 is a graph showing a relation between a ratio in a resistance and a thickness of the first semiconductor layer of the silicon carbide substrate according to the embodiment of the present invention.

FIGS. 18 and 19 show a relation between the thickness and a ratio of the resistance of the first semiconductor layer 11 in cases of the impurity concentration of the first semiconductor layer 11 that are $1 \times 10^{16}$, $3 \times 10^{16}$ and $1 \times 10^{17}$ cm$^{-3}$. A solid line shown in FIGS. 18 and 19 indicates a calculation value. A vertical axis of each of FIGS. 18 and 19 indicates the ratio of the resistance of the first semiconductor layer 11 with respect to a total resistance of the element, and a horizontal axis of the same indicates the thickness of the first semiconductor layer 11. In the case of the MOSFET, the total resistance of the element is a resistance between the source and the drain provided when a sufficiently large positive voltage (such as about 15 V) is applied to the gate to turn ON it. FIG. 18 shows a graph in a case in which the rated voltage of the element is 3300 V, and FIG. 19 shows a graph in a case in which the rated voltage of the element is 1200 V. FIGS. 18 and 19 show graphs in cases in which the n-type impurity concentration of the first semiconductor layer 11 is $1\times10^{16}$, $3\times10^{16}$ and $1\times10^{17}$ cm$^{-3}$, respectively.

In the silicon carbide substrate in the present modification example, the n-type impurity concentration of the first semiconductor layer 11 is set to be higher than $1\times10^{16}$ cm$^{-3}$ and equal to or lower than $1\times10^{17}$ cm$^{-3}$, and the thickness of the first semiconductor layer 11 is set to be 0.5 to 2 μm, based on the measurement results shown in FIGS. 18 and 19. In this manner, increase in the resistance value of the first semiconductor layer 11 can be prevented. The thickness of the first semiconductor layer 11 of 0.5 to 1 μm is further effective because of suppressing the increase in the resistance.

Therefore, the present modification example can prevent the increase in the resistance of the silicon carbide substrate caused by the BPD growth due to electron-hole recombination and prevent the increase in the resistance of the silicon carbide substrate caused by the large thickness or the lower impurity concentration. In other words, the characteristic deterioration of each of the silicon carbide substrate and the semiconductor device can be prevented by the usage of the semiconductor device using the silicon carbide substrate, and therefore, the reliability of the silicon carbide substrate can be improved.

The present modification example can suppress the propagation of the basal plane dislocation (BPD) into the epitaxial layer, and therefore, the basal plane dislocation density of the drift layer 3 is equal to or lower than 0.03 [1/cm$^2$]. Further, when the impurity concentration of the first semiconductor layer 11 is used in the low concentration state, the basal plane dislocation density of the drift layer 3 is equal to or lower than 0.01 [1/cm$^2$].

Third Embodiment

In the above-described embodiments, the case in which the relation among the impurity concentration N2 of the second semiconductor layer 2, the thickness W2 of the second semiconductor layer 2 and the rated voltage Vn of the element satisfies the equation (1) has been explained. In the present third embodiment, explanation will be made about improvement of each of the element reliability and the conversion efficiency from the BPD to the TED caused when the impurity concentration N2 of the second semiconductor layer 2 (see FIG. 2), the thickness W2 of the second semiconductor layer 2 and the maximum current density "J" in the usage of the element satisfy a predetermined equation.

Configurations of a silicon carbide substrate and a semiconductor device using the silicon carbide substrate according to the present third embodiment are the same as those of the above-described embodiments. As shown in the graph on the right side of FIG. 2, the scale relation in the impurity concentration is expressed as "the SiC substrate 1, the second semiconductor layer 2>the first semiconductor layer 11>the drift layer 3". The scale relation in the impurity concentration between the SiC substrate 1 and the second semiconductor layer 2 is not defined. However, the principal feature of the present third embodiment is to form the first semiconductor layer (basal-plane-fault conversion layer) 11 having the impurity concentration lower than that of the SiC substrate 1, on the SiC substrate 1 having the high concentration to be in contact with the principle surface of the SiC substrate 1, and to set the impurity concentration N2 of the second semiconductor layer 2 formed on the first semiconductor layer 11, the thickness W2 of the second semiconductor layer 2 and the maximum current density "J" in the usage of the element to satisfy a relation expressed by the following equation (3).

$$W2 \geq (2.52\times10^{12} \ln(J) - 1.31\times10^{13})N2^{-0.65} \qquad (3).$$

Note that the current density simply described in the present specification means the maximum current density in the usage of the element. The rated voltage of the element is set to have a margin for the input voltage for each application, and is, for example, 1700 V, 3300 V, 6500 V or others in application to rail vehicles, or 600 V, 1200 V or others in application to automobiles.

The scale relation in the impurity concentration of the silicon carbide substrate of the present third embodiment preferably satisfies "SiC substrate 1>Second semiconductor layer 2>First semiconductor layer 11>Drift layer 3". For example, if the impurity concentration of the drift layer 3 is $2\times10^{16}$ cm$^{-3}$, the impurity concentration of the first semiconductor layer 11 is definitely higher than $2\times10^{16}$ cm$^{-3}$. If the impurity concentration of the second semiconductor layer 2 is $1\times10^{17}$ cm$^{-3}$, the impurity concentration of the first semiconductor layer 11 is definitely lower than $1\times10^{17}$ cm$^{-3}$.

The second semiconductor layer 2 needs to have a function of attenuating the minority carrier implanted from the power device formed above the drift layer 3 so that an amount of the minority carriers is sufficiently small in the second semiconductor layer 2. Therefore, the impurity concentration N2 of the second semiconductor layer 2, the thickness W2 of the second semiconductor layer and the maximum current density J of the element need to satisfy the relation of the equation (3).

<Effect of Present Third Embodiment>

Next, an effect of the silicon carbide substrate according to the present third embodiment will be explained with reference to FIGS. 20 and 21. In FIG. 20, a plot shows data that is interpolated to be derived from practical measurement, and a broken line shows an approximate curve of a modeled plot. In FIG. 21, a plot shows data that is sampled from the approximate curve of FIG. 20, and a broken line shows an approximate curve of the plot.

A lot of BPD exist in the SiC substrate 1. When the BPDs are taken over to the drift layer 3, the BPDs are expanded to be the stacking fault by the minority carrier implanted in the general operation of the element, and, as a result, element resistance increases. The BPD can be converted to the TED by the formation of the first semiconductor layer 11 having a largely-different impurity concentration from that of the SiC substrate 1, and the element reliability in the general operation of the element can be improved. The lower the impurity concentration of the first semiconductor layer 11 is, or the thicker the first semiconductor layer 11 is, the higher the conversion efficiency from the BPD to the TED is.

Meanwhile, the stacking fault is expanded from the substrate to increase the element resistance when the minority carriers reach the SiC substrate 1 under the circumstances such as the current surge in which more minority carriers than usual are implanted. Under such circumstances, the effect is not exerted even if the BPD in the drift layer 3 is reduced. FIG. 20 shows a graph illustrating a relation between the thickness and the impurity concentration of the second semiconductor layer 2 preventing the expansion of the stacking fault from the substrate in the element of each current-density class. A vertical axis of the graph shown in FIG. 20 indicates the thickness of the second semiconductor layer 2, and a horizontal axis of the same indicates the n-type impurity concentration of the second semiconductor layer 2.

FIG. 20 shows a graph relating to the current density of 600 A/cm$^2$ illustrated by a circle plot, a graph relating to the current density of 400 A/cm$^2$ illustrated by a triangle plot, a graph relating to the current density of 300 A/cm$^2$ illustrated by a rhombic plot, and a graph relating to the current density of 200 A/cm$^2$ illustrated by a square plot. These graphs show that the number of the minority carriers implanted into the element can be sufficiently attenuated in the second semiconductor layer 2 if the relation between the thickness and the impurity concentration shown in FIG. 20 is satisfied. Therefore, the thickness or the impurity concentration of the second semiconductor layer 2 in the element of each current-density class is only necessarily equal to or larger than the value shown in FIG. 20.

The higher the current-density class is, the larger the necessary value of the thickness or the impurity concentration of the second semiconductor layer 2 is, and therefore, a relation between the current density and a coefficient of the relation between the thickness and the impurity concentration expressed by power law (Thickness ∝ Impurity concentration$^{-0.65}$) is illustrated as a graph shown in FIG. 21. In other words, if the equation (3) is satisfied, the expansion of the stacking fault from the substrate can be also prevented, and the long-period reliability of the element can be enhanced. A vertical axis of the graph shown in FIG. 21 indicates the coefficient, and a horizontal axis of the same indicates the maximum current density of the element. For example, "1" of the coefficient shown in the vertical axis of FIG. 21 means 1×10$^{12}$.

In the foregoing, the invention made by the present inventors has been concretely described on the basis of the embodiments. However, it is needless to say that the present invention is not limited to the foregoing embodiments and various modifications can be made within the scope of the present invention.

What is claimed is:

1. A silicon carbide substrate comprising:
a first substrate having a predetermined conductive type and containing silicon carbide;
a first semiconductor layer having the conductive type and containing silicon carbide, on the first substrate;
a second semiconductor layer having the conductive type and containing silicon carbide, on the first semiconductor layer; and
a third semiconductor layer having the conductive type and containing silicon carbide, on the second semiconductor layer,
wherein the first semiconductor layer is in contact with an upper surface of the first substrate,
wherein a first impurity concentration of the first semiconductor layer is lower than both a second impurity concentration of the second semiconductor layer and a fourth impurity concentration of the upper surface of the first substrate,
wherein the first impurity concentration is higher than a third impurity concentration of the third semiconductor layer,
wherein the fourth impurity concentration is higher than the second impurity concentration,
wherein the second impurity concentration N2 [cm$^{-3}$], a thickness W2 [μm] of the second semiconductor layer and a rated voltage Vn [V] of an element formed on the silicon carbide substrate satisfy a condition expressed by the following equation (1);

$$W2 \geq (-2.69 \times 10^{12} \ln(Vn) + 2.22 \times 10^{13})N2^{-0.65} \qquad (1);$$

wherein a thickness of the first semiconductor layer is greater than 1 μm and less than 2 μm,
wherein the second semiconductor layer attenuates minority carriers injected into the third semiconductor layer, and
wherein the rated voltage Vn is 1700 V or more.

2. The silicon carbide substrate according to claim 1, wherein the first impurity concentration is higher than 1×10$^{16}$ cm$^{-3}$ and equal to or lower than 1×10$^{17}$ cm$^{-3}$.

3. A silicon carbide substrate comprising:
a first substrate having a predetermined conductive type and containing silicon carbide;
a first semiconductor layer having the conductive type and containing silicon carbide, on the first substrate;
a second semiconductor layer having the conductive type and containing silicon carbide, on the first semiconductor layer; and
a third semiconductor layer having the conductive type and containing silicon carbide, on the second semiconductor layer,
wherein the first semiconductor layer is in contact with an upper surface of the first substrate,
wherein a first impurity concentration of the first semiconductor layer is lower than both a second impurity concentration of the second semiconductor layer and a fourth impurity concentration of the upper surface of the first substrate,
wherein the first impurity concentration is higher than a third impurity concentration of the third semiconductor layer,
wherein the fourth impurity concentration is higher than the second impurity concentration,
wherein the second impurity concentration N2 [cm$^{-3}$], a thickness W2 [μm] of the second semiconductor layer and a rated voltage Vn [V] of an element formed on the silicon carbide substrate satisfy a condition expressed by the following equation (2);

$$W2 \geq (-2.53 \times 10^{12} \ln(Vn) + 2.16 \times 10^{13})N2^{-0.65} \qquad (2);$$

wherein a thickness of the first semiconductor layer is greater than 1 μm and less than 2 μm,
wherein the second semiconductor layer attenuates minority carriers injected into the third semiconductor layer, and
wherein the rated voltage Vn is 1700 V or more.

4. The silicon carbide substrate according to claim 3, wherein the first impurity concentration is higher than 1×10$^{16}$ cm$^{-3}$ and equal to or lower than 1×10$^{17}$ cm$^{-3}$.

5. A silicon carbide substrate comprising:
a first substrate having a predetermined conductive type and containing silicon carbide;
a first semiconductor layer having the conductive type and containing silicon carbide, on the first substrate;
a second semiconductor layer having the conductive type and containing silicon carbide, on the first semiconductor layer; and
a third semiconductor layer having the conductive type and containing silicon carbide, on the second semiconductor layer,
wherein the first semiconductor layer is in contact with an upper surface of the first substrate,
wherein a first impurity concentration of the first semiconductor layer is lower than both a second impurity concentration of the second semiconductor layer and a fourth impurity concentration of the upper surface of the first substrate, wherein the first impurity concentration is higher than a third impurity concentration of the third semiconductor layer, wherein the fourth impurity concentration is higher than the second impurity concentration, wherein the second impurity concentration N2 [cm$^{-3}$], a thickness W2 [μm] of the second semiconductor layer and the maximum current density J [A/cm$^2$] in usage of an element formed on the silicon carbide substrate satisfy a condition expressed by the following equation (3);

$$W2 \geq (2.52 \times 10^{12} \ln(J) - 1.31 \times 10^{13}) N2^{-0.65} \qquad (3);$$

wherein a thickness of the first semiconductor layer is greater than 1 μm and less than 2 μm, wherein the second semiconductor layer attenuates minority carriers injected into the third semiconductor layer, and wherein the maximum current density J is 200 A/cm$^2$ or more.

6. The silicon carbide substrate according to claim 5, wherein the first impurity concentration is higher than 1×10$^{16}$ cm$^{-3}$ and equal to or lower than 1×10$^{17}$ cm$^{-3}$.

* * * * *